(12) United States Patent
Chaki et al.

(10) Patent No.: US 11,624,000 B2
(45) Date of Patent: Apr. 11, 2023

(54) GRAPHENE ENHANCED AND ENGINEERED MATERIALS FOR MEMBRANE TOUCH SWITCH AND OTHER FLEXIBLE ELECTRONIC STRUCTURES

(71) Applicants: Alpha Assembly Solutions Inc., Waterbury, CT (US); MacDermid Autotype Limited, Wantage (GB)

(72) Inventors: Nirmalya Kumar Chaki, Karnataka (IN); Chetan Pravinchandra Shah, Karnataka (IN); Barun Das, Karnataka (IN); Supriya Devarajan, Karnataka (IN); Siuli Sarkar, Karnataka (IN); Rahul Raut, Sayreville, NJ (US); Bawa Singh, Marlton, NJ (US); Anubhav Rustogi, Edison, NJ (US); Anna Jane Harris, Wantage (GB); Keith Paul Parsons, Swindon (GB); Jeffrey William Braham, Newbury (GB)

(73) Assignees: Alpha Assembly Solutions Inc., Waterbury, CT (US); MacDermid Autotype Limited, Wantage (GB)

( * ) Notice: Subject to any disclaimer, the term of this patent is extended or adjusted under 35 U.S.C. 154(b) by 64 days.

(21) Appl. No.: 16/616,701

(22) PCT Filed: May 22, 2018

(86) PCT No.: PCT/US2018/033779
§ 371 (c)(1),
(2) Date: Nov. 25, 2019

(87) PCT Pub. No.: WO2018/217682
PCT Pub. Date: Nov. 29, 2018

(65) Prior Publication Data
US 2020/0087528 A1    Mar. 19, 2020

(30) Foreign Application Priority Data

May 23, 2017 (IN) .............................. 201711018067

(51) Int. Cl.
*C09D 11/52* (2014.01)
*C09D 11/033* (2014.01)
(Continued)

(52) U.S. Cl.
CPC ............ *C09D 11/52* (2013.01); *C09D 11/033* (2013.01); *C09D 11/037* (2013.01);
(Continued)

(58) Field of Classification Search
CPC ..... C09D 11/033; C09D 11/10; C09D 11/037; C09D 11/101; C09D 11/104;
(Continued)

(56) References Cited

U.S. PATENT DOCUMENTS

| 4,007,682 A | 2/1977 | Gundlach |
| 2001/0036978 A1 | 11/2001 | Kohler et al. |

(Continued)

FOREIGN PATENT DOCUMENTS

| CN | 103666034 A | 3/2014 |
| TW | 201221586 A | 6/2012 |

(Continued)

OTHER PUBLICATIONS

Khan "Technologies for Printing Sensors and Electronics Over Large Flexible Substrates: A Review" IEEE Sensors Journal, vol. 15, No. 6, Jun. 2015 (Year: 2015).*

(Continued)

*Primary Examiner* — Tri V Nguyen
(74) *Attorney, Agent, or Firm* — Stinson LLP

(57) ABSTRACT

This invention discloses formulations of mutually compatible sets of graphene, graphene-carbon, metal and dielectric (Continued)

inks for the fabrication of high performance membrane touch switches (MTS). The compositions of these inks are optimized to achieve higher degree of compatibility with highly engineered polymeric substrates, thereby offering a holistic solution for fabricating high-performance MTS. These sets of materials can also be used for fabrication of sensors, biosensors and RFIDs on flexible substrates, such as polymers and papers.

15 Claims, 12 Drawing Sheets

(51) Int. Cl.
    *C09D 11/037*     (2014.01)
    *C09D 11/104*     (2014.01)
    *H01H 13/704*     (2006.01)

(52) U.S. Cl.
    CPC ......... *C09D 11/104* (2013.01); *H01H 13/704* (2013.01); *H01H 2209/016* (2013.01)

(58) Field of Classification Search
    CPC ..... C09D 11/322; C09D 11/324; C09D 11/52; H01H 13/704; H01L 27/1292; H05K 1/095; H05K 2201/0323; H05K 3/12
    USPC ............... 428/411.1; 977/755, 788
    See application file for complete search history.

(56) References Cited

U.S. PATENT DOCUMENTS

| | | |
|---|---|---|
| 2008/0049086 A1 | 2/2008 | Rolly |
| 2011/0088931 A1 | 4/2011 | Lettow et al. |
| 2011/0232524 A1 | 9/2011 | Kim et al. |
| 2012/0170171 A1 | 7/2012 | Lee et al. |
| 2013/0033810 A1* | 2/2013 | Crain .................. C09D 7/62 977/734 |
| 2013/0142963 A1 | 6/2013 | Kirk et al. |
| 2014/0151606 A1 | 6/2014 | Lowenthal et al. |
| 2015/0024122 A1 | 1/2015 | Wu et al. |
| 2015/0322257 A1 | 11/2015 | Hirano et al. |
| 2016/0190244 A1 | 6/2016 | Lee et al. |
| 2017/0135215 A1 | 5/2017 | Morshed |
| 2020/0235245 A1* | 7/2020 | Torrisi ............ H01L 29/66522 |

FOREIGN PATENT DOCUMENTS

| | | |
|---|---|---|
| WO | 98/08361 A1 | 2/1998 |
| WO | 2015/102149 A1 | 7/2015 |
| WO | 2016054484 A1 | 4/2016 |
| WO | 2017048633 | 3/2017 |

OTHER PUBLICATIONS

Buder-Stroisznigg "Flexible clear coats—Effect of curing conditions." Progress in Organic Coatings 65 (2009) 44-48 (Year: 2009).*
International Search Report of the International Searching Authority for PCT/US2018/033779 dated Sep. 17, 2018.
Zheng Dehai et al., "Screen Printing Process" (Second Edition), Printing Industry Press, English Translation of pp. 529-531, 2006.

* cited by examiner

Layer 1: Ag ink on PET,
Layer 2: Dielectric ink on Ag ink

Layer 1: Ag ink on PET,
Layer 2: Graphene ink on Ag ink
Layer 3: Dielectric ink on Graphene ink Layer 1: Dielectric ink on PET

GRAPHENE ENHANCED AND ENGINEERED MATERIALS FOR MEMBRANE TOUCH SWITCH AND OTHER FLEXIBLE ELECTRONIC STRUCTURES

FIELD OF THE INVENTION

The present invention relates generally to a unique set of materials used in combination with engineered polymer substrates for fabricating high-performance membrane touch switches (MTS) and similar structures, that have substantial advantages over the prior art. The disclosed materials enable the fabrication of MTS and similar structures, having superior robustness, environmental durability/ruggedness, mechanical flexibility and improved operational life.

BACKGROUND OF THE INVENTION

Membrane touch switches (MTS) are widely used as electronic switches in various electrical controls and in other "human-machine interface" type applications. Membrane touch switches (MTS) are also known as membrane switches, membrane keypads, membrane keyboards, tactile switches, momentary switching device, touchpads, membrane panel and flexible switches. In Germany, MTS are also referred as Folientastaturen and Membrantastaturen. These terms are used herein to refer to membrane touch switches (MTS) and the disclosed set of materials as well as fabrication approaches described herein are applicable to different types of MTS structures.

MTS devices are typically multi-layer structures. FIG. 1 is a schematic of a generic MTS device and comprises:
 a) a rigid base supporting layer,
 b) a circuit layer on a flexible substrate,
 c) an overlay adhesive, and
 d) a top graphic layer.

Conducting and dielectric inks printed on flexible polymeric films substrates are often used to produce these layers.

Polymer films used for many MTS applications include, but are not limited to, polyesters, such as polyethylene terephthalate (PET), polyimide (PI) and polycarbonate (PC). Additionally, paper and other polymeric substrates, such polyetherimide (PEI) can also be used as substrates for MTS fabrication. Substrate attributes and performance are a critical factor in the performance of MTS devices.

Materials traditionally used in the manufacture of MTS circuits comprise electrically conducting inks such as silver inks and carbon inks, and electrical insulation, i.e., "dielectric" layers made from dielectric polymers. These dielectric inks are also commonly screen printed on polymer film substrates and then dried and cured at relatively low temperatures, e.g., <150° C.

Often, carbon inks are employed, sometimes in combination with dielectric inks, to protect the underlying fragile silver interconnect circuits from mechanical and environmental interactions. Depending on the functionality and complexity, a MTS device may comprise multiple conductor layers isolated by dielectric layers.

Advancements in human-machine interface technologies and the continued miniaturization in all electronic systems continues to increase the complexity, demands for high reliability and longer operational life of MTS devices. This in turn necessitates substantially improved performance of the entire MTS structures.

Thus, next-generation MTS devices need to be physically more flexible, mechanically robust, and in some cases be able to operate in adverse environmental conditions. Thus, improved MTS ink materials and substrates are needed for producing MTS devices that meet these more demanding requirements.

Some of the problems with associated prior art materials and substrate include but are not limited to, the following failure modes:

a) Circuit breakage: Conductor lines can exhibit breakage failure if the MTS device is subjected to mechanical deformation or bending as traditional silver conducting materials are not designed for this degree of flexibility.

b) Dielectric layer failures: These are most often due to pinholes or cracks in the insulating dielectric materials. Mechanical, environmental and thermal stressing can aggravate the occurrence of cracks and pinhole related failures.

c) Abrasion damage to the protective carbon layers and silver layers: Usually this failure mode is encountered at the switch portions of the MTS device. Specifically, this is caused by abrasion due to the repeated actuations of the metal dome of the switch.

d) Silver electromigration issues: Electromigration is a known problem related to silver. It is electrochemical in nature, causing dendritic growths of silver, resulting in electrical shorts or other related failures. A common solution employed in traditional MTS is to protect silver conductors with an overcoat carbon ink and/or dielectric ink because silver electromigration is aggravated in the presence of moisture. However, traditional carbon and dielectric inks are not effective as moisture barriers.

e) Gas, chemicals and moisture ingress issues: This failure mode is similar to that of electro-migrations, in which sulfur-containing gases and various chemicals can degrade the properties of silver lines.

f) Tail connector failures: The tail connector portion of a MTS device comprises silver lines with a protective overcoat of carbon. This region is subjected to abrasion and bending stresses that result in breakage at the clamping area.

The inventors of the present invention propose an innovative set of mutually compatible materials for producing MTS circuit elements that can be used in conjunction with engineered substrates to overcome many of the failure modes and limitations associated with prior art. Additionally, the approach described herein imparts an additional benefit and provides for capabilities that enhance the performance and substantially extends the operational life. The approach focuses on the improvements in circuitry materials, as well as substrates, to produce superior devices.

The present invention proposes innovative and mutually compatible materials sets, based on graphene-carbon, graphene, metal and dielectric inks, for fabricating MTS and similar structures.

To fabricate high performing MTS structures, the inventors have identified the following key attribute enhancements regarding the circuit materials:

1) After curing, the various ink materials should possess sufficient level of stretchability to handle some degree of flexing without cracking or breakage during use;
2) Further, after curing, the combined stack, needs to have sufficient mechanical robustness to withstand repeated impact and abrasion under the switch dome;
3) Additionally, after curing, these materials need to have sufficient flexibility to overcome bending stresses at the edge and tail connector;
4) The dielectric and carbon ink materials should be corrosion resistant and act as a barrier to moisture, gases and chemicals, especially at elevated temperatures and humidity conditions;

5) Cured carbon ink materials should simultaneously be flexible and abrasion resistant, thus imparting increased durability and robustness at the switch locations;
6) All materials used should be mutually compatible with each other as well as with the substrates being employed; and
7) The various ink materials that comprise the stack should be cost effective and well suited for facile manufacturing of MTS device structures.

The engineered polymer substrate of the invention can be of various compositions as long as meets the physical and chemical properties noted elsewhere herein. Typical examples of engineered polymer substrates are polyester and polycarbonate-based films with optional primer layers to facilitate adhesion to the material set described herein and also to other materials that may be used in the MTS construction, such as decorative inks. Preferably a polyester-based film is used, and most preferably a thermally stabilized polyester-based film.

To fabricate high performing MTS structures, the inventors have also identified the following key attribute enhancements regarding the substrate material:

a) The material set must show robust adhesion to the engineered polymer substrate;
b) After printing with the material set, the substrate must be capable of being folded back on itself without damage to the stack;
c) The substrate material should be capable of being formed into a 3D tactile shape without loss of mechanical functionality;
d) Substrate material should be capable of being flexed no less than 500,000 times without mechanical fatigue;
e) Substrate material has a thickness of between 50 μm and 200 μm;
f) Substrate material should be thermally stabilised at a minimum temperature of 90° C. in order to maintain print registration when material set is adequately cured;
g) Substrate material shall lay fundamentally flat at the point of printing;
h) Substrate material should behave as a dielectric with sufficient electrical insulation to prevent short circuiting of the material set; and
i) Substrate material should resist a wide range of solvents and household chemicals.

There is a need in the art for an improved fabrication method and an improved set of materials to fabricate MTS and similar structures having superior robustness, environmental durability, mechanical flexibility and improved operational life.

SUMMARY OF THE INVENTION

The present invention describes a unique set of materials for fabricating high performance membrane touch switches (MTS) that have substantial advantages over the prior art.

It is an object of the present invention to enable the fabrication of high performance MTS structures, with substantially superior robustness.

It is another object of the present invention to substantially improve the physical robustness, overall reliability and the operational life of MTS structures.

It is still another object of the present invention to disclose a cost-effective alternative to traditional pure silver inks, which substantially reduces the cost of MTS.

It is still another object of the present invention to propose an alternate means to fabricate high performance MTS structures to shorten the manufacturing time. UV-curable (partially or fully) silver ink formulations are disclosed that can be UV-cured with or without the need of additional thermal treatment.

It is still another object of the present invention to demonstrate the need for a mutually compatible set of next-generation materials and their use with high performance, engineered polymer substrates, thereby offering a holistic approach and solution for fabricating high performance MTS.

It is still another object of the present invention to provide unique materials that can also be used for the fabrication of electronic/electrical circuits and structures for applications such as sensors, biosensors and RFIDs etc. on flexible and rigid substrates.

It is still another object of the present invention to provide compatible inks on highly engineered polyester substrates.

It is still another object of the present invention to define a set of next generation materials and inks for MTS fabrication, in particular: graphene-carbon, graphene, metal and dielectric inks, which are designed to be fully compatible with each other.

It is still another object of the present invention to provide a unique polymer binder system described herein as a common platform or base for subsequent formulation of graphene-carbon, graphene and metal inks.

It is still another object of the present invention to provide graphene-carbon and graphene inks, which are substantially more robust and highly durable for MTS fabrication.

It is still another object of the present invention to optimize the selection of different grades of graphenes to leverage graphene's mechanical properties to substantially improve and enhance the performance of MTS structures, while keeping crucial paste attributes such as rheology and electrical conductivity within the desired range to enable facile manufacturing.

It is still another object of the present invention to disclose graphene-carbon and graphene ink formulations, where different grades of graphene flakes are used solely or in combinations with other carbon materials, such as graphite and/or carbon black in suitable ink compositions.

It is still another object of the present invention to disclose graphene ink formulations, which may or may not contain any polymer binder.

It is still another object of the present invention to disclose metal ink formulations, which contain an organic ink vehicle and other conducting metal and metal alloy filler particles alone or in combination with graphene flakes.

It is still another object of the present invention to provide the addition of graphene flakes or metal coated graphene flakes to metal inks for MTS applications.

It is still another object of the present invention to provide a unique polymer composition for dielectric ink formulations such that the cured material has some degree of flexibility along with the requisite encapsulation and dielectric properties.

It is still another object of the present invention to disclose the use of graphene or 2D boron nitride in a dielectric ink formulation. Combinations of graphene and 2D boron nitride flake's unique mechanical, flexible and barrier properties are highly beneficial to enhance the flexibility, toughness and encapsulating properties of dielectric polymeric matrix, thereby enhancing the operational life of MTS.

It is still another object of the present invention to disclose dielectric inks that are suitable for use as protective overcoating, preferably be applied or used as a conformal coating to fully encapsulate the MTS or similar other devices.

It is still another object of the present invention to disclose graphene-carbon, graphene, metal and dielectric inks that can be cured using different curing methods.

It is still another object of the present invention to disclose graphene-carbon, graphene, metal and dielectric inks that can be printed using different printing methods.

It is still another object of the present invention to disclose the use of graphene to permit the fabrication of more complex, curved or conformed or 3D conformed MTS structures, and to allow the structures to be produced on flat substrates and formed into 3D or curved structures.

It is still another object of the present invention to disclose the use of graphene flakes that will serve as a barrier against ingress of gases, moisture and chemicals to the MTS.

It is another object of the present invention to provide a barrier that will protect against ingress of sulphur containing gases and subsequent degradation of silver interconnects. In automotive applications protection of silver from sulphur containing gases is of high importance.

It is another object of the present invention to minimize or eliminate silver electromigration issues particularly in-high humidity applications.

It is another object of the present invention to disclose the use of graphene as a protective overcoat on the entire silver interconnect circuitry.

It is another object of the present invention to provide a graphene overcoat that can serve as protective overcoat (barrier) as well as providing a secondary conductor that augments the conductivity of underlying silver.

It is yet another object of the present invention to provide a graphene overcoat that will give stretchability to the circuitry.

It is another object of the present invention to impart graphene with greater abrasion resistance, thereby greatly enhancing duty cycle or overall device operational life.

It is still another object of the present invention to provide graphene-carbon inks, graphene inks, metal inks and dielectric inks that can be cured using different curing methods. For example, the inks can be thermally cured/dried using, but not limited to, hot air drying or oven drying or reflow oven drying process, or can be cured using radiation, such UV radiation, IR radiation or by laser heating or by energy beam radiations.

It is still another object of the present invention to provide graphene-carbon inks, graphene inks, metal inks and dielectric inks that can be printed using different printing methods.

It is still another object of the present invention to optimize viscosity and rheology of the inks for fine circuitry line printing (such as stencil printing and screen printing), jetting (such as, ink jetting and aerosol jetting) and spraying.

It is still another object of the present invention to optimize viscosity and rheology of the inks for large areas using tape casting and doctor blade coating.

To that end, in one embodiment, the present invention relates generally to a multilayered structure comprising:
  a) a flexible substrate;
  b) a layer comprising a metal ink;
  c) a layer comprising a graphene ink; and
  d) a layer comprising a dielectric ink.

BRIEF DESCRIPTION OF THE FIGURES

For a fuller understanding of the invention, reference is made to the following description taken in connection with the accompanying figures, in which.

DETAILED DESCRIPTION OF THE PREFERRED EMBODIMENTS

Figure 1:
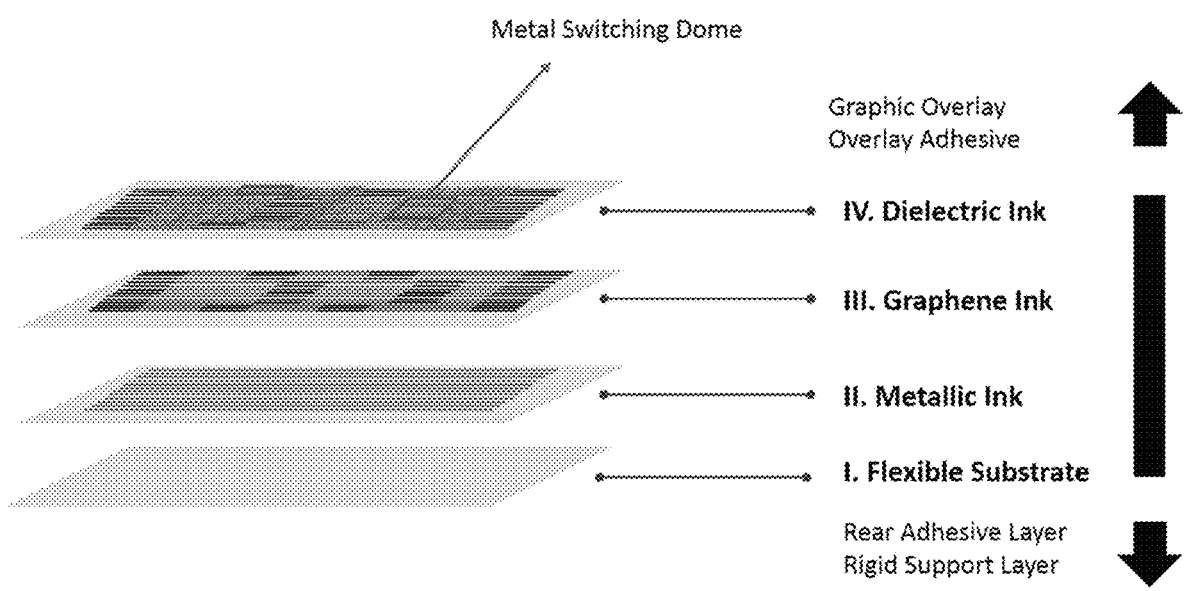
FIG. 1 depicts a schematic representation of a typical MTS (membrane touch switch) anatomy.

The present invention relates generally to a unique set of materials used in combination with engineered polymer substrates in the manufacture of multi-layered structures such as membrane touch switches.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper", "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein the term "high compatibility" means a compatibility of at least 3B, preferably at least 4B, more preferably 5B as tested using adhesion testing according to ASTM D3359 method.

In one embodiment the present invention relates generally to a multilayered structure comprising a flexible substrate, a layer comprising a metal ink, a layer comprising a graphene ink, and a layer comprising a dielectric ink.

The engineered substrate for MTS fabrication desirably exhibits the following characteristics:
1) The engineered substrate is fully compatible with the material set, offering excellent adhesion and print quality characteristics;
2) Barrier properties of the substrate are significantly enhanced by printing with graphene material;
3) The engineered substrate retains print registration when the material set is printed and cured under recommended conditions;
4) Adhesion performance with the material set is not compromised by normal UV doses used to cure the dielectric ink;
5) The engineered substrate combined with the material set delivers enhanced flexibility allowing acceptable performance even after creasing through 180°; and
6) The engineered substrate is capable of being printed with the material set and formed into polydomes with enhanced flexibility and durability.

The present invention also proposes high performance graphene-carbon, graphene, metal and dielectric inks for MTS fabrication.

The novel polymer binder present in the graphene-carbon, graphene and metal inks described herein has the following advantages:
1) Designed to enhance key attributes, such as adhesion, flexibility, robustness, toughness and for increasing the weatherability (environmental durability) of the dried or cured metal and carbon interconnects. These attributes are crucial for enhancing the performance and increased operational life of MTS devices.
2) Determines, in large part, the rheology of the inks, which in turn affects the printing attributes. Properties of this polymer binder can be tuned to achieve the required fine or complex printing.
3) Determines interaction of the finish structure with environmental conditions, such as, moisture, corrosive gases and chemicals.
4) Designed to provide high compatibility with polymer substrates, including but not limited to, polyester and polycarbonate substrates, which are critical requirements for MTS fabrication.
5) Conducting polymer components present in the novel polymer binder may further improve the electrical conducting properties of metal, carbon and graphene interconnects, especially while being stretched or placed under other forms of mechanical stress.
6) Determines the compatibility and adhesion of conductor inks with the dielectric ink and substrates.

Advantages of using graphene-carbon and graphene inks for MTS fabrication include the following:
1) Graphene enhances the mechanical properties of the carbon interconnects, which improves the robustness of the MTS, making it more suitable for use under conditions of mechanical stress.
2) Graphene enhances the gas and moisture barrier properties of carbon interconnects, thus providing excellent corrosion resistance to the underlying conducting interconnects.
3) Graphene reinforces polymer binders, which enhances the overall stability of the carbon interconnects' flexibility, stretchability, storage modulus, Young's modulus and coefficient of thermal expansion (CTE).
4) Barrier properties of graphene are especially advantageous in preventing electromigration of metal interconnect layers.
5) Combinations of graphene's unique mechanical, flexible and barrier properties are highly beneficial for the preparation of flexible, mechanically robust, abrasion resistant and corrosion resistant carbon layers, thereby enhancing the operational life of MTS.

Many end applications and products will be best served by using a mixture of graphenes and/or by adding other graphitic forms, such as carbon black, graphite platelets and carbon nanotubes along with graphenes.

Silver inks exhibiting high electrical conductivity can be designed by optimizing size and shape distribution of silver particles. Additionally, mixed nano-sized silver particles, or organo-silver compounds are also used.

One of the key advantages of using low-cost conducting filler particles is to sustainably reduce the cost of conducting inks, especially when moderate electrical conductivities are required.

Key advantages of uses of graphene in the metal inks are as follows:
1) Leveraging electrical conducting properties of graphene reduce the cost of metal inks, especially when moderate electrical conductivities along with higher silver electromigration stability is required.
2) Leveraging mechanical properties of graphene enhance the mechanical properties of metal inks, which improves the robustness of the MTS and enables it to be operated at high mechanically stressed conditions.
3) Leveraging moisture barrier properties of graphene enhance the corrosion resistance and reduce the electromigration of the metal interconnects.
4) Additionally, graphene reinforces polymer binders, which enhances the overall stability of the metal interconnects' flexibility, stretchability, toughness, storage modulus, Young's modulus and CTE.

5) Combinations of graphene's unique mechanical, flexible and barrier properties are highly beneficial for the production of flexible, mechanically robust, abrasion resistant and corrosion resistant metal layers, thereby enhancing the operational life of MTS.

In one embodiment the present invention relates generally to improving the functionality of the cured polymeric matrix by the judicious selection of appropriate combinations of different functional resins and optimization of their reactivity.

Advantages of such unique dielectric polymeric compositions include excellent flexibility with certain degree of stretchability, superior adhesion and compatibility with other ink materials (silver and graphene) and substrates along with excellent weather/environmental resistance (moisture, gas and chemical resistant) as well as excellent dielectric properties.

The polymer compositions of the dielectric inks described herein, can be used for spraying or ink jet printing when viscosities are appropriate and can also be used for providing conformal coating or encapsulation of MTS, sensors, biosensors or other electronic devices.

Key advantages of the use of graphene and 2D boron nitride flakes in the dielectric ink are as follows:

1) Leveraging mechanical properties of graphene and 2D boron nitride flakes enhances the mechanical properties of dielectric inks, which improves the robustness of the MTS and enables it to be operated under high mechanical stress conditions.
2) Leveraging moisture barrier properties of graphene 2D boron nitride flakes enhances the encapsulation properties of dielectrics. This function is especially important for enhancing the corrosion resistance and reducing the electromigration of the metal interconnects.
3) Additionally, graphene 2D boron nitride flakes reinforce the dielectric polymeric matrix, which enhances the overall stability of the MTS device. This improves the flexibility, stretchability, toughness, storage modulus, Young's modulus and CTE of dielectric polymeric matrix.
4) Combinations of graphene and 2D boron nitride flake's unique mechanical, flexible and barrier properties are highly beneficial for the production of flexible, mechanically robust, abrasion resistant and corrosion resistant dielectric polymeric matrix, thereby enhancing the operational life of MTS.

Some key attributes of the polyester substrates described herein are as follows:

1) Crystalline biaxially oriented polyethylene terephthalate (PET);
2) High tensile strength compared to polycarbonate (PC) leading to long life in MTS applications;
3) PET is ductile enough to allow the embossing of polydomes with good tactile response and longevity;
4) Excellent tear resistance makes it particularly suitable for circuitry tails;
5) Shatter resistant;
6) Excellent chemical resistance—Can be used in challenging environments;
7) Thermally stable—low shrinkage after thermal cure of inks gives excellent print registrations;
8) Available in a variety of grades—clear, white, translucent—which give different handling characteristics;
9) Excellent lay flat properties for good print registration;
10) Good level of stiffness/rigidity where the gauge gives the material good processing characteristics;
11) Can be cut accurately and cleanly;
12) Dielectric properties and surface resistivity mean that PET is a good electrical insulator, ideal for circuitry applications;
13) Good moisture barrier properties;
14) Surface is receptive to conductive and dielectric inks, giving good adhesion;
15) Surface energy is compatible with incumbent ink technology and third party adhesives;
16) Stable performance over a wide range of environmental conditions; and 17) Light weight, low waste, low cost, flexible circuitry substrates.

One of the key aspects of the graphene, graphene-carbon and metal ink formulations described herein is the use of the unique polymer binder described herein, which is primarily responsible for making these inks highly flexible, tough and robust.

Another key aspect of this invention is the use of graphene for formulating graphene, graphene-carbon, and metal inks. Graphene flakes are electrically and thermally conducting novel 2D materials, having a combination of several unique properties, such as flexibility, toughness, high Young's modulus and provide excellent barrier properties against moisture, gases and chemicals. Combinations of graphene's unique mechanical, flexible and barrier properties are highly beneficial for the preparation of flexible, mechanically robust, abrasion resistant and corrosion resistant carbon layers, thereby enhancing the operational life of MTS. Additionally, incorporation of graphene to metal inks, enables the development of high-performing, low cost metal inks, with moderate electrical conductivities.

The optimized composition of different grades of graphene along with other carbon materials, such as graphite and carbon black can be used to formulate high-performing graphene inks. Similarly, particle size distribution and composition of conducting metal fillers are also very important to balance the electrical conductivities, cost, mechanical properties and corrosion stability of metal inks.

Another key aspect of the present invention is the unique polymer composition of the dielectric ink formulations. These cured polymer matrices possess excellent dielectric properties and are highly flexible and moderately stretchable, have superior adhesion and compatibility with other ink materials (e.g. silver and graphene) and substrates and have excellent weather resistance (moisture, gas and chemicals).

In one embodiment, the unique polymer binder described herein is present in graphene, graphene-carbon and metal inks. The polymer binder is a unique combination of one of several mixtures of polymer resins, which provides the specific characteristics to the formulation. This unique polymer binder can be one or mixtures of thermoplastic resins, which contain one or more halogen groups (such as chlorine and fluorine) and are either homo-polymers or co-polymers, bearing either ester or thiol or nitrile or acid or phenoxy or hydroxy or amine or amide or acrylate functional groups; and contain either solely or in combinations with other thermoplastic resins and may additionally contain one or more mixtures of thermoset network forming resins along with one or more mixtures of conducting polymers.

In one embodiment, this polymer binder system comprises homo-polymers or co-polymers of thermoplastic resins (25-100 wt %) along with polyester resin (1-50 wt %) and/or phenoxy resin (1-20 wt %) and/or mixtures of thermoset network forming resins (1-50 wt %). The thermoplastic resins may be, for example, poly(vinylidene chloride), poly(vinylidene chloride-co-acrylonitrile), poly(vinylidene chloride-co-methyl acrylate), poly(acrylonitrile-co-vinylidene chloride-co-methyl methacrylate), or combinations of one or more of the foregoing.

These thermoplastic resins may be used alone or combinations with other thermoplastic resins, which contain, ethylene copolymers, bearing either esters or nitrile or acid or phenoxy or hydroxy or acrylates functional groups; or phenoxy resins, which may contain polyester or polyacrylate or polyurethane or polyether or polyamide backbones; or polyester resins, bearing polyols or hydroxyls or amines or carboxyl acids or amides or aliphatic chains; or polyacrylate resins, bearing polyols or hydroxyls or amines or carboxyl acids or amides or aliphatic chains; or polyurethane resins, bearing polyols or hydroxyls or amines or carboxyl acids or amides or aliphatic chains; or polyimide resins, bearing polyols or hydroxyls or amines or carboxyl acids or amides or aliphatic chains; acrylic resins like polyacrylonitrile (PAN), polymethyl methacrylate (PMMA), polybutyl methacrylate (PBMA), halopolymers like polytetrafluorethylene (PTFE), polyvinylidene fluoride (PVDF), polyvinyl chloride (PVC), polyvinylidene chloride (PVDC) aliphatic polyamides (PA) such as Nylon 6, aromatic polyamides such as aramides, poly(m-phenyleneisophtalamide), poly(p-phenyl eneterephtalamide), polyesters such as polybutylene terephtalate (PBT), polycarbonates (PC), polyethylene terephthalate (PET), polyvinyl acetate (PVAc), polyethylene such as low-density polyethylene (LDPE), high-density polyethylene (HDPE), ethylene vinyl acetate (EVA) and ethylene vinyl alcohol (EVOH), styrene derivatives such as polystyrene (PS), acrylonitrile-butadiene-styrene (ABS) terpolymer, styrene-acrylonitrile copolymer, polyoxymethylene (POM) and copolymers, polyphenylene ether (PPE), polyphenylene sulphide (PPS), polypropylene (PP), polyvinyl alcohol (PVOH), Polyvinyl chloride (PVC) and thermoplastic elastomers like TPU (polyurethanes).

Examples of suitable ethylene copolymers or ter-polymer of ester, nitrile and acrylate groups include ethylene-ethyl acrylate copolymer (EEA), ethylene-methyl methacrylate copolymer (EMMA), ethylene-vinyl acetate copolymer (EVA), ethylene vinyl acetate copolymer (ELVAX available from Dupont™), ethylene-methacrylic acid copolymer and Elvaloy® resins (available from Dupont™).

The phenoxy resin is preferably a thermoplastic bisphenol-A based polyether containing polyester or polyacrylate or polyurethane compounds. Examples of suitable phenoxy resins containing polyester or poly acrylate or polyurethanes include phenoxy resins available under the tradenames LEN-HB, PKHW-35, PKHA and PKHS-40 (all available from InChem Corporation).

Thermoset network forming resins may contain polyester or polyacrylate or polyurethane backbones. The reaction of epoxy with hardeners like amine, acid, anhydrides, reaction of acid or its derivative with amine, reaction of acid or its derives with alcohol, reaction of multiple carbon-carbon bond having allyl, vinyl, methacrylate, methacrylamide functionality, reaction of hydroxy and isocyanate can form three-dimensional thermosetting resin networks. The thermoset network produced are classified as either polyether, polyacrylate, polyurethane, polyester or polyamide.

Examples of conducting polymers include, but are not limited to, polyacetylene, polypyrrole, polythiophene, polyphenylene, polyacetylene, poly(p-phenylene vinylene), polyaniline, and their derivatives.

Organic solvent based graphene-carbon and graphene ink vehicles may comprise organic solvents, the unique polymer binder described herein, other polymeric binders, surfactants, rheology modifiers, functional additives and antioxidants.

Aqueous based graphene-carbon and graphene ink vehicles may comprise water, the unique polymer binder described herein, other polymeric binders, surfactants, rheology modifiers, functional additives and antioxidants.

Various types of solvents can be used either alone or in mixtures with varying compositions. The examples of solvents include, but are not limited to, N-methyl pyrrolidone, N,N-dimethyl formamide, dihydrolevoglucosenone (Cyrene®), cyclohexanone; diols, such as, ethylene glycol, propylene glycol, dipropylene glycol, 1,3-butane diol, 2,5-dimethyl-2,5-hexane diol; glycol ethers, such as ethylene glycol monobutyl ether, diethylene glycol mono-n-butyl ether, propylene glycol n-propyl ether, terpineol, butyl carbitol acetate, glycol ether acetates, carbitol acetate, propylene carbonate, and combinations of one or more of the foregoing.

For an aqueous-based graphene ink, water can be used exclusively or as the major solvent media. The water used is preferably free from any charged ions and impurities and is termed as either D.M. water, D.I. water, Nano-pure water, Millipore water or Mili-Q water.

The unique polymer binder or other polymeric binders can be used alone or as mixtures. Different polymeric constituents can be any polymeric binder materials described herein.

The surfactants may comprise ionic or non-ionic surfactants. Non-limiting examples include surfactants available under the tradenames SPAN® 80 (available from Sigma-Aldrich), SPAN® 20 (available from Sigma-Aldrich), Tween® 80 (available from Sigma-Aldrich), Triton™ X-100 (available from Sigma-Aldrich), Sorbitan, IGEPAL® CA-630 (available from Sigma-Aldrich), Nonidet P-40 (available from Sigma-Aldrich), Cetyl alcohol, Capstone® FS-3100 (available from Chemours™), Masurf® FS-2800 (available from Pilot Chemical), Masurf® FS-2900 (available from Pilot Chemical), Masurf® FS-230 (available from Pilot Chemical), and Capstone® FS-30 (available from Chemours™).

Rheology Modifiers are organic or inorganic additives that control the rheological characteristics of the formulation. These can be used alone or in a mixture. Examples of suitable rheology modifiers include, but are not limited to, those available under the tradenames THIXCIN® R (available from Elementis Specialties), Crayvallac® Super (available from Everchem Specialty Chemicals), Brij® 35, Brij® 58, Brij® L4, Brij® O20, Brij® S100, Brij® 93, Brij® C10, Brij® O10, Brij® L23, Brij® O10, Brij® S10 and Brij® S20 (all available from Sigma-Aldrich).

Functional additives can be used alone or in a mixture and organic molecules, polymers, surfactants or inorganic materials may be especially to improve the functional features of the formulations, for examples, to improve wetting or surface finish.

Graphene samples which may be in the form of graphene flakes may be procured from several commercial suppliers but not limited to XG Sciences, Angstron materials, United-nanotech, Thomas Swan, Abalonyx, Graphenea, Sigma-Aldrich and United Nanotech. Alternatively, graphene flakes can be prepared by liquid phase exfoliation (modified Hummers' method), high-shear mixing and electrochemical exfoliation of graphite flakes and sheets.

Graphite, which may be in the form of graphite flakes, may be procured from Graphite India, Birla, Alfa-aesar, Timrex, Sigma-Aldrich, Asbury Graphite Mill Inc. and Superior Graphite Corp.

Carbon black may be procured from Cabot Corp., Asbury Graphite Mill Inc., Birla and ENSACO®.

Organic ink vehicles for metal inks may contain the unique polymer binder described herein, solvents, surfactants, rheology modifiers and optionally one or more of, antioxidants, and/or thermal initiators and UV initiators.

The organic solvent may be on one or more solvents as described herein.

The unique polymer binders described herein can be used alone or in mixtures of resins as described herein.

Surfactants can be used alone or mixtures of surfactants as described herein.

Rheology modifiers can be used alone or as mixtures of rheology modifier as described herein.

Functional additives can be used alone or in a mixture and they are either organic molecules, polymers, surfactants or inorganic materials as discussed herein, especially to improve the functional features of the formulations, for example, to improve wetting or surface finish. These functional additives may be present as antioxidants, inhibitors, thermal initiators or UV-curing initiators.

Metal fillers may be procured from commercial sources such as Sigma-Aldrich, Alfa-Aesar, Dowa, Ferro and CuLox.

The organo-silver compound may comprise one or more of short or long chain carboxylic acids (C=1 to 30), including, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate.

Dielectric inks may contain different combinations of cross-linkable monomer, dimer, trimer, tetramer, penta or hexamer and oligomers having epoxy, polyurethane, polyester, polyether and acrylic backbones, solvents, functional additives, antioxidants and inhibitors, coloring agents, dyes and pigments, UV-curing initiators, thermal curing initiators, and organic-inorganic fillers.

The carbon-carbon thermoplastic resins preferably have multiple carbon-carbon bonds that have either allyl or vinyl, or methacrylate, methacrylamides, N-vinyl lactam, N-vinyl amide, unsaturated hydrocarbons with functional groups like ester, halide, hydroxy, amine, thiol, acid, ester and amide. Non-limiting examples include, but are not limited to, N,N-dimethylacrylamide, N,N-dimethylmethacrylamide, N-hydroxyethyl acrylamide, N-vinyl-pyrrolidone, N-vinylpyrrole, N-vinyl succinimide, alkyl vinyl ethers, 2-acrylamido glycolic acid, 2-hydroxyethyl methacrylate (HEMA), hydroxypropyl methacrylate, dimethylaminoethyl methacrylate, glycerol methacrylate, 2-ethyl hexyl acrylate, butyl acrylate, isooctyl acrylate, methyl methacrylate, lauryl acrylate, dodecyl acrylate, tetrahydrofurfuryl acrylate, bisphenol A-ethoxylate dimethacrylate, butyl acrylate, acrylic acid, vinyl acetate, allyl alcohol, acrylic acid, methacrylic acid, vinyl acetate, glycidyl methacrylate, trimethylolpropane triacrylate, isobornyl acrylate, poly(ethylene glycol) methacrylate, 2-(diethylamino)ethyl methacrylate, 2-(diethylamino)ethyl acrylate, N-vinyl caprolactum, N-vinylformamide, N-vinyl acetamide, N-vinyl imidazole, 2-acrylamidoglycolic acid, aminopropyl methacrylate, 3-tris(trimethylsiloxy)silylpropylmethacrylate (TRIS), and bis-(trimethylsiloxy)methylsilylpropyl methacrylate.

Polyurethane resins comprise a reaction product of hydroxy terminated polyol, hydroxy terminated poly(ethylene oxide), hydroxy terminated poly(dimethylsiloxane) and trimethylolpropane ethoxylate with methylbenzyl isocyanate, (trimethylsilyl) isocyanate, 1-naphthyl isocyanate, 3-(triethoxysilyl) propyl isocyanate, phenyl isocyanate, allyl isocynate, butyl isocyanate, hexyl isocyanate, cyclohexyl isocyanate, furfuryl isocyanate, isophorone diisocyanate, hexamethylene diisocyanate, m-xylylene diisocyanate, 1,4-cyclohexylene diisocyanate, poly(propylene glycol), and tolylene 2,4-di-isocyanate.

Epoxy resins may also be used and examples of the epoxy component, include, but are not limited to bisphenol-A epoxy, 4-vinyl-1-cyclohexene 1,2-epoxide, 3,4-epxoy cyclohexyl mehyl-3',4'-epoxy cyclohexene carboxylate, 1,4-butanediol diglycidyl ether, trimethylolpropane triglycidyl ether, triglycidyl isocyanurate, epoxy siloxane, epoxy silane and phenol novolac epoxy. The hardeners may be either amine, such as butyl amine, N,N-diethyl amino ethanol, or amino ethanol, acid such as oleic acid, adipic acid, or glutaric acid, or anhydrides such as succinic anhydrides, phthalic anhydrides and maleic anhydride.

Epoxy acrylates may also be used. Methacrylates are produced by a ring opening reaction of 1,4-butanediol diglycidyl ether, bisphenol-A epoxy, 4-vinyl-1-cyclohexene 1,2-epoxide, 3,4-epxoy cyclohexyl mehyl-3',4'-epoxy cyclohexene carboxylate, trimethylolpropane triglycidyl ether, triglycidyl Isocyanurate, epoxy siloxane, epoxy silane, phenol novolac epoxy with methacrylic acid.

Polyurethane acrylates such as urethane acrylate, methacrylate terminated polyurethane and modified isocynate with hydroxy ethyl methacrylate may also be used.

Polyester acrylates such as fatty acid modified pentaerythritol acrylate, trimethylolpropane triacrylate and methacrylated mono saccharides may also be used.

Polyether acrylates such as poly(ethylene glycol) methyl ether acrylate, poly(ethylene glycol) methacrylate, poly(ethylene glycol) dimethacrylate may also be used.

Non-limiting examples of monomer acrylates include, but are not limited to, methacrylic acid, 3-(trimethoxysilyl) propyl methacrylate, isoborynyl acrylate, tetrahydrofufuryl acrylate, poly(ethylene glycol) methyl ether acrylate, hydroxypropyl methacrylate, dimethylaminoethyl methacrylate, 2-ethyl hexyl acrylate, butyl acrylate, isooctyl acrylate, methyl methacrylate, lauryl acrylate, dodecyl acrylate and tetrahydrofurfuryl acrylate.

Non-limiting examples of dimer acrylates include dimer methacrylates such as poly(ethylene glycol) dimethacrylate, 1,6-bis(acryloyloxy)hexane, bisphenol A-ethoxylate dimethacrylate and neopentyl glycol diacrylate 1,3-butanediol diacrylate.

Non-limiting examples of trimer acrylates include trimer methacrylates such as trimethylolpropane triacrylate, pentaerythritol triacrylate and 1,3,5-triacryloylhexahydro-1,3,5-triazine.

Non-limiting examples of tetramer acrylates include pentaerythritol tetracrylate and di(trimethylolpropane) tetraacrylate.

Non-limiting examples of penta or hexamer acrylates include dipentaerythritol penta-acrylate and Dipentaerythritol hexa-acrylate.

Suitable solvents include alcohols, glycol ethers, glycol ester, ketones, ester and hydrocarbon. Non-limiting examples of solvents include, for example, methanol, ethanol, 2-propanol, benzyl alcohol, ethylene glycol, ethylene glycol methyl ether, butyl carbitol, butyl cellosolve, heptane, hexane, cyclohexane, benzene, xylene, dihydrolevoglucosenone, dibasic ester, isophorone, C11-ketone, and toluene. These solvents can be used alone or in combination with each other.

Functional additives are additives which can improve rheology or any other functional characteristics of the formulation, such as de-foamers, which remove the foam from the formulation, de-tackifiers, which remove the tack from the system under study, slip additives, anti-sag agent, etc. Additionally, additives such as leveling agents, surface active agents, surface tension reducing agents and matting agents may be added to the composition to provide performance and process advantages. Non-limiting examples include BYK-UV 3500, BYK-UV 3505, BYK-077, BYK-UV 3530 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins) and Additol® LED 01 (available from Annex). Examples of other functional additives include organic fillers including natural polymers such as cellulose fibers, wood flour and fibers, starch, and synthetic polymers such as polyamide, polyester and aramid.

Non-limiting examples of antioxidants and inhibitors include 2,6-di-tert-butyl-4-methylphenol, 2,6-di-tert-butyl-p-cresol, butylhydroxytoluene, 3,5-di-tert-4-butylhydroxytoluene, Omnistab® IC (available from IGM resins), Omnistab® IN 515 (available from IGM resins), Omnistab® IN 516 (available from IGM resins), hydroquinone and phenothiazine.

The non-limiting examples of coloring agents, dyes and pigments include anthraquinone dyes, azo dyes, acridine dyes, cyanine dyes, diazonium dyes, nitro dyes, nitroso dyes, quinone dyes, xanthene dyes, fluorene dyes and rhodamine dyes.

UV curing Initiators: Several suitable photoinitiators commercially available include Irgacure® 184 (1-hydroxy-cyclohexyl-phenyl-ketone), Irgacure® 819 (bis(2,4,6-trimethylbenzoyl)-phenylphosphineoxide), Irgacure® 1850 (a 50/50 mixture of bis(2,6-dimethoxybenzoyl)-2,4,4-trimethylpentyl-phosphine oxide and 1-hydroxy-cyclohexyl-phenyl-ketone), Darocur® MBF (a pheny glyoxylic acid methyl ester) and Darocur® 4265 (50/50 mixture of diphenyl (2,4,6-trimethylbenzoyl)-phosphine oxide and 2-hydroxy-2-methyl-1-phenyl-propan-1-one, a mixture of phosphine oxide), Irgacure® 2022 (a mixture of Irgacure® 819 (phosphine oxide, phenyl bis(2,4,6-trimethyl benzoyl)) (20 wt %), and Darocur® 1173 (2-hydroxy-2-methyl-1-phenyl-1-propanone) (80 wt %)) and 2-hydroxy-2-methyl-1-phenyl-propan-1-one), Irgacure® 1700 (a 25/75 mixture of bis(2,6-dimethoxybenzoyl)-2,4,4-trimethylpentyl-phosphine oxide and 2-hydroxy-2-methyl-1-phenylpropan-1-one), Irgacure® 907 (2-methyl-1[4-(methylthio)phenyl]-2-morpholonopropan-1-one) and can be used alone or in combination.

Thermal curing initiators can also be used and suitable non-limiting examples include azobisisobutyronitrile (AIBN), 2,2'-azobis(2-methylbutyronitrile), 2,2'-azobis(2-methylpropionamidine) dihydrochloride, dicumyl peroxide, benzoyl peroxide and tert-butyl peroxide.

Fillers include inorganic fillers graphene, and 2D boron nitride flakes, which can be used alone or in combination. Non-limiting examples include mica, silica, talc, alumina, barium titanate, graphene, boron nitride and combinations of one or more of the foregoing.

The following ink printing and testing procedures were used in the examples set forth herein:

1) Ink Processing: Constituents of ink formulations were mixed together using either a high shear mixer or ultra-sonication or through probe-sonication or by other related mechanical mixing techniques. Additionally, the mixture was homogenized by milling using three-roll mill for few minutes.
2) Ink Characterizations: The viscosities of ink formulations were measured using a Brookfield Cone and Plate Viscometer, model HB DV-III Ultra with CP51 spindle. All viscosity measurements were carried out at 5 rpm at 25.1° C. The temperature was controlled using a Brookfield TC-502 digital temperature controller.
3) Ink Printing: Ink formulations were tested for printing, spraying, dispensing and jetting by adjusting their viscosity and rheology accordingly. The formulated inks were screen printed for various test patterns using polyester, stainless steel and nylon mesh having varied sizes. Additionally, different test patterns were stencil printed using stainless steel stencils. Commercially, screen and stencil printers (e.g. DEK printer, ATMA Printer) are generally used to perform printing experiments. Print features, print repeatability and ink stability during printing are excellent and meet specific requirements for MTS fabrications. Several of these ink formulations were tested for spraying and ink jetting using ASI Prism Ultra Coat 300 and PiXDRO Inkjet Printer, respectively and showed excellent printing features on various substrates.
4) Ink Drying Procedure: As printed inks were cured or dried at 60-250° C. in a box oven under air atmosphere for 1-90 minutes. The thicknesses of the cured or dried printed features were measured with an optical microscope or screw gauge.
5) Adhesion Testing Procedure: The printed and cured or dried inks were tested for their adhesion on various PET substrates using a cross hatch tape test as described in ASTM D3359. The rating of adhesion is given in 0B to 5B as per ASTM D3359 method, where 0B denotes no adhesion, while 5B denotes excellent adhesion.
6) Pencil Hardness Test: To determine the resistance of the dried or cured ink materials to scratch effects on the surface, a pencil hardness test was performed as described in ASTM D 3363.
7) Flexibility Test: Flexibility of the printed and cured or dried inks were tested by folding a test print, ink side out around a Meyer bar as described in ASTM 1683. Crease testing was also carried out.
8) RCA Abrasion Testing: RCA abrasion testing of the printed and cured or dried inks were performed as described in ASTM F2357, determining the abrasion resistance of inks and coatings on membrane switches using the Norman Tool Inc. RCA Abrasion Wear Tester.
9) Electrical Resistivity Measurement Procedure: Surface resistances of printed and cured or dried inks were measured by applying current through the known area of the printed metal, graphene and graphene-carbon inks using a Fluke multimeter. Surface resistance wes converted to electrical conductivity, which is inversely proportional to its resistance. The lower the resistance, the higher is the conductivity and vice versa.
10) Dielectric Measurement Procedure: Dielectric breakdown voltage of cured dielectric inks is measured by applying voltage through known thickness of printed ink and measuring corresponding changes in the current. The voltage values before the dielectric break down, indicate that the material was behaving as a dielectric up to that voltage. The higher the breakdown voltage, the better is the dielectric property.

11) Characterization of Metal, Carbon, Graphite and Graphene Materials: Metal, carbon, graphite and graphene materials were characterized using various characterization methods, including, Powder X-ray diffraction (PXRD), Raman Spectroscopy, Field-emission Scanning Electron Microscopy (FESEM) and Energy dispersive analysis of X-rays (EDAX). Powder XRD pattern of these materials was recorded with a Rigaku Smartlab X-ray Diffractometer operating at 40 kV and 30 mA CuKα radiation with a wavelength of 1.54 A and a step size of 0.02° in the 2θ range between 5–70°. Raman spectra were recorded with a Horiba Jobin Yvon LabRAM HR evolution Raman spirometer equipped with 632 nm He—Ne Laser. FESEM Model: JEOL JSM-7800F Prime was used for microscopic imaging of these materials. EDS (Energy Dispersive Spectra) analysis was carried out using EDAX Genesis.

Ink Formulation Examples and Characteristics:

The present invention describes graphene and graphene-carbon inks formulations, where different grades of graphene materials (graphene A-D) were used solely or in combinations with other carbon materials, such as graphite and/or carbon black in suitable ink vehicles.

Characteristics of Graphene, Graphite and Carbon Black Materials:

Table 1 summarizes the characteristics of different grades of graphene materials (Graphene A-D) along with other carbon materials, such as graphite and carbon black.

Figure 2:
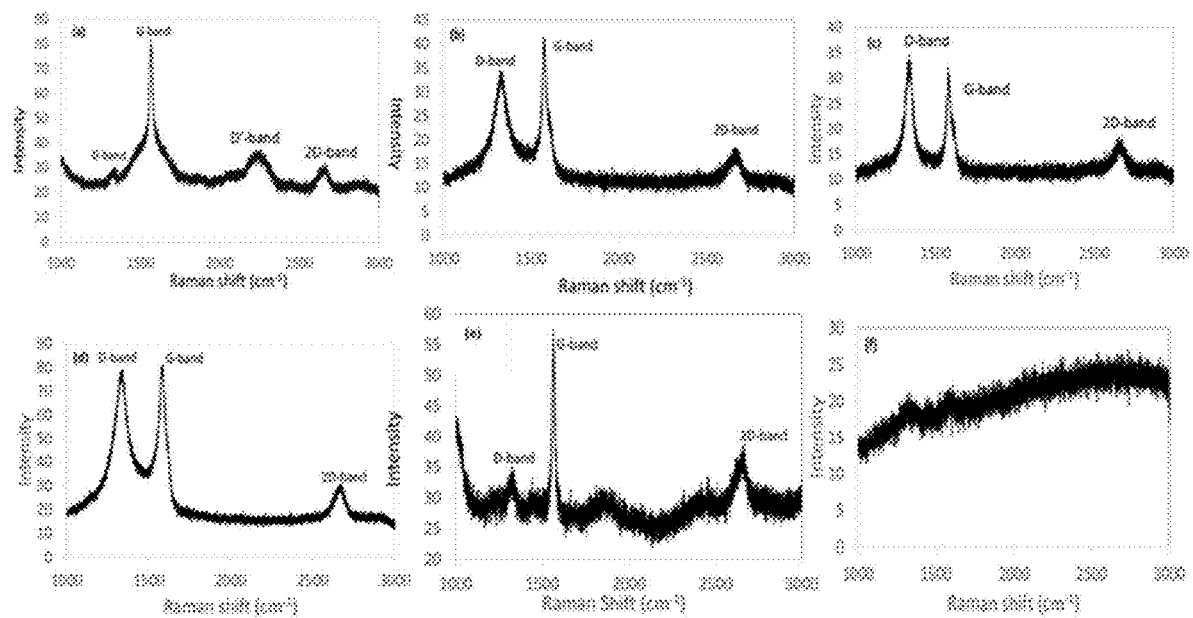
FIGS. 2(a)-(f) depict Raman spectra of graphene Grades A-D, graphite and carbon black respectively.
Figure 3:
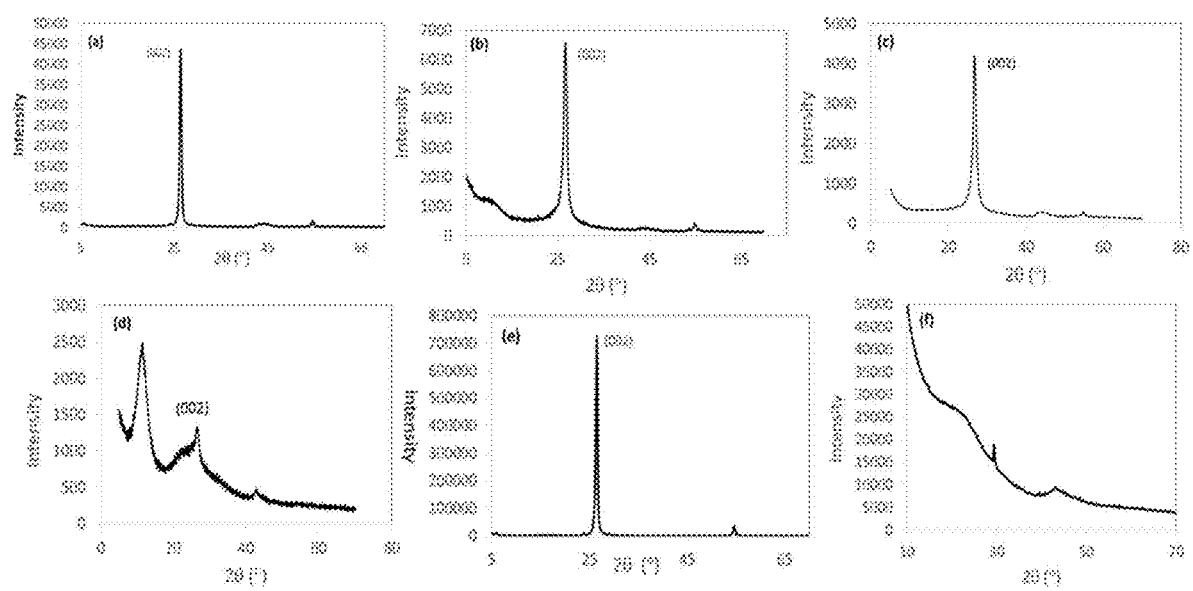
FIGS. 3(a)-(f) depict Powder X-ray diffraction (PXRD) patterns of graphene Grade A-D, graphite and carbon black respectively.
Figure 4:
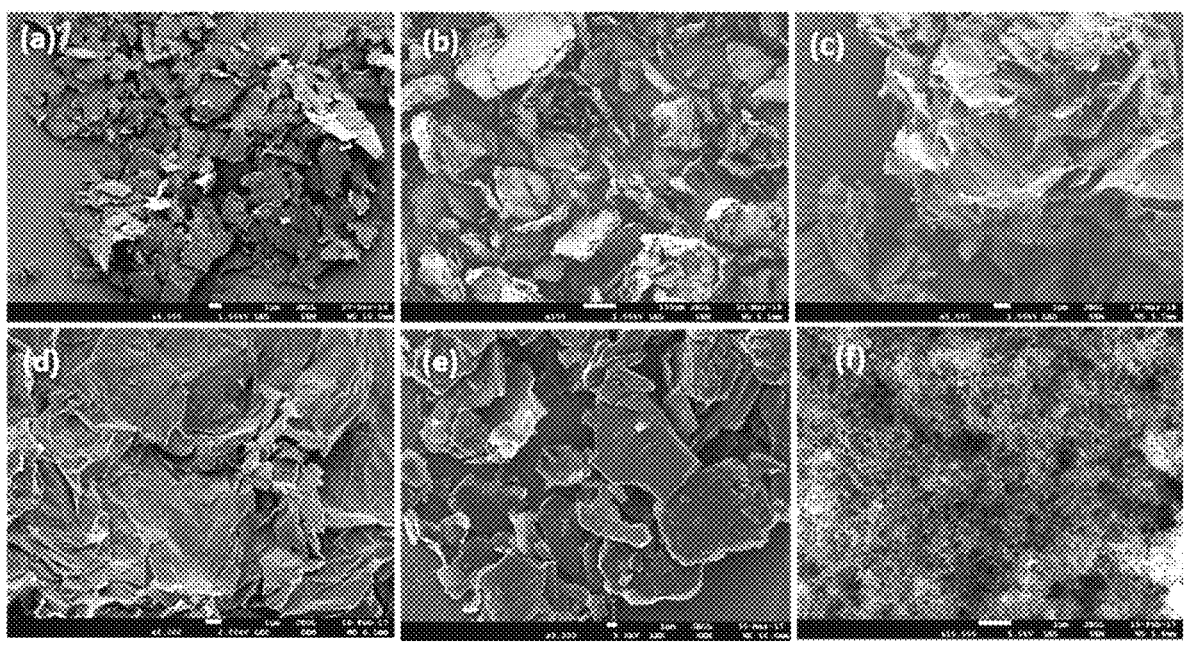
FIGS. 4(a)-(f) depict field-emission scanning electron microscopic (FESEM) images of graphene Grade A-D, graphite and carbon black respectively.

FIGS. 2 through 4 represent typical characteristic properties of various grades of graphene, graphite and carbon black materials respectively. FIGS. 2(a-f) shows Raman spectra of four different grades of graphene materials (Graphene A-D), graphite and carbon black respectively. The lower I(D)/I(G) values observed in graphene Grade A as compared to graphene Grades B-D reveals that graphene Grade A is more pristine and has less defects as compared to the other grades. Apart from this, a broad and short D' band is seen in the Raman spectrum of graphene Grade A, which is marked in FIG. 2(a). This band does not appear in other grades of graphenes as seen in FIGS. 2(b) to 2(d). In comparison, prominent D, G and 2D bands are present for graphite, while weak and noisy Raman signal is observed for carbon black samples, as seen in FIGS. 2(e) and 2(f), respectively. The graphitic nature of various carbon materials can be characterized by PXRD method, where highly crystalline samples show an intense and sharp (002) peak; corresponding to the ordering of $sp^2$ bonded carbons along z-direction. For example, FIGS. 3(a) to 3(c) reveal higher degree of crystallinity for graphene grade A as compared to graphene grades B and C. On the contrary, PXRD pattern of graphene Grade D as shown in FIG. 3(d), exhibits two broad peaks positioned at 10° and 25° of 2θ, respectively, which may be due to an increase of inter-planar distance as result of the incorporation of oxygen functional groups in the flakes. In sharp contrast, FIG. 3(e) shows the typical PXRD pattern of bulk graphite sample exhibiting an intense diffraction (002) peak around 2θ=25°; clearly indicating the higher degree of crystallinity of $sp^2$ bonded carbons along z-direction in the bulk graphite, while carbon black samples show very weak ordering and low crystallinity, has shown in FIG. 3(f). Morphology of different types of carbon materials are shown in FIGS. 4(a) to 4(f), corresponding to FESEM images of graphene Grade A-D, graphite and carbon black, respectively. For example, flake-like morphologies are evident for graphene Grade A-D and graphite samples, while spherical morphology with a highly networked microstructure is evident for carbon black samples.

Different grades of graphene flakes such as A, B, C and D can be used alone or in combination with other carbon materials, such as graphite and/or carbon black in various ink formulations. These inks are either organic solvent-based or aqueous-based. Organic solvent based graphene ink vehicles may comprise organic solvents, the unique polymer binder described herein, surfactants, rheology modifiers, functional additives, and antioxidants. Aqueous-based graphene ink vehicles may comprise water, the unique polymer binder described herein and/or another polymeric binder, surfactants, rheology modifiers, functional additives, and antioxidants.

The polymeric binder system may contain homo-polymers or co-polymers of thermoplastic resins (25-100 weight %) along with polyester resin (1-50 weight %) and/or phenoxy resin (1-20 weight %) and/or mixtures of thermoset network forming resins (1-50 weight %).

The organic solvent system may contain one or more mixtures of N-methyl pyrrolidone, N, N-dimethyl formamide, dihydrolevoglucosenone, ketones such as cyclohexanone, isophorone, C11-ketone, ethylene glycol, propylene glycol, dipropylene glycol, 1,3-butane diol, 2,5-dimethyl-2,5-hexane diol, ethylene glycol monobutyl ether, diethylene glycol mono-n-butyl ether, propylene glycol n-propyl ether, terpineol, acetates such as butyl carbitol acetate, glycol ether acetates, carbitol acetate, various dibasic esters and propylene carbonate.

The surfactants may comprise one or more of SPAN® 80 (available from Sigma-Aldrich), SPAN® 20 (available from Sigma-Aldrich), Tween® 80 (available from Sigma-Aldrich), Triton™ X-100 (available from Sigma-Aldrich), Sorbitan, IGEPAL® CA-630 (available from Sigma-Aldrich), Nonidet P-40 (available from Sigma-Aldrich), Cetyl alcohol, Capstone® FS-3100 (available from Chemours™), Masud® FS-2800 (available from Pilot Chemical), Masurf® FS-2900 (available from Pilot Chemical), Masurf® FS-230 (available from Pilot Chemical), and Capstone® FS-30 (available from Chemours™).

TABLE 1

|  | Graphene Grade A | Graphene Grade B | Graphene Grade C | Graphene Grade D | Graphite | Carbon Black |
|---|---|---|---|---|---|---|
| Lateral Dimension (mm) | 1-50 | 1-50 | 0.1-10 | 0.1-50 | 1-25 | 0.01-20 |
| Thickness (mm) | 0.001-0.1 | 0.001-0.1 | 0.001-0.2 | 1-50 | 0.1-5 | — |
| Oxygen Content (wt %) | 0.1-5 | 1-20 | 1-20 | 10-40 | 0.1-5 | 0.1-5 |

The rheology modifier may comprise one or mixture of THIXCIN® R (available from Elementis Specialties), Crayvallac® Super (available from Everchem Specialty Chemicals), Brij® 35 like BYK-UV 3500, BYK-UV 3505, BYK-077, BYK-UV 3530, BYK-S 781, BYK-S 782, BYK-A 535 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins), Additol® LED 01 (available from Allnex) and synthetic polymers like polyamide, polyester and aramid., Brij® 58, Brij® L4, Brij® 020, Brij® 5100, Brij® 93, Brij® C10, Brij® O10, Brij® L23, Brij® O10, Brij® S10 and Brij® S20 (all available from Sigma-Aldrich).

Functional additives may comprise one or mixture of a de-foamer, a de-tackifier, slip additives, anti-sag agent and leveling agents like BYK-UV 3500, BYK-UV 3505, BYK-077, BYK-UV 3530, BYK-S 781, BYK-S 782, BYK-A 535 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins), Additol® LED 01 (available from Allnex) and synthetic polymers like polyamide, polyester and aramid.

Graphene and graphene-carbon ink formulation examples are described below:

Example 1

4-14 wt % of graphene Grade B, 0.1-1.5 wt % of surfactants and 90-95 wt % of organic solvents were mixed together using an orbital mixer at 1000 rpm. After mixing, the mixture is milled in a three-roll mill for a few minutes to obtain a homogeneous paste.

Example 2

5-15 wt % of graphene Grade B, 0.1-10 wt % of polymer binder, 0.1-1.5 wt % of surfactants and 80-95 wt % of organic solvents were mixed together using an orbital mixer at 1000 rpm. After mixing, the mixture is milled in a three-roll mill for a few minutes to obtain a homogeneous paste.

Example 3

10-30 wt % of graphene Grade A, 1-10 wt % of carbon black, 5-20 wt % of polymer binder, 0.1-1.5 wt % of surfactants, 0.02-0.1 wt % of rheology modifiers, 0.02-0.1 wt % of functional additives and 40-80 wt % of organic solvents were mixed together using an orbital mixer at 1000 rpm. After mixing, the mixture is milled in a three-roll mill for a few minutes to obtain a homogeneous paste.

Example 4

10-30 wt % of graphene Grade A, 1-10 wt % of graphene Grade C, 1-10 wt % of carbon black, 5-20 wt % of polymer binder, 0.02-0.1 wt % of rheology modifiers, 0.02-0.1 wt % of functional additives and 40-80 wt % of organic solvents were mixed together using an orbital mixer at 1000 rpm. After mixing, the mixture is milled in a three-roll mill for a few minutes to obtain a homogeneous paste.

Example 5

10-30 wt % of graphene Grade A, 1-10 wt % of graphene Grade B, 1-10 wt % of carbon black, 5-20 wt % of polymer binder, 0.02-0.1 wt % of rheology modifiers, 0.02-0.1 wt % of functional additives and 40-80 wt % of organic solvents were mixed together using an orbital mixer at 1000 rpm. After mixing, the mixture is milled in a three-roll mill for a few minutes to obtain a homogeneous paste.

Example 6

1-25 wt % of graphene Grade A, 1-25 wt % of graphite, 1-10 wt % of carbon black, 5-20 wt % of polymer binder, 0.02-0.1 wt % of rheology modifiers, 0.02-0.1 wt % of functional additives and 20-30 wt % of organic solvents were mixed together using an orbital mixer at 1000 rpm. After mixing, the mixture is milled in a three-roll mill for a few minutes to obtain a homogeneous paste.

Example 7

10-30 wt % of graphite, 1-20 wt % of carbon black, 5-20 wt % of polymer binder, 0.02-0.1 wt % of rheology modifiers, 0.02-0.1 wt % of functional additives and 40-80 wt % of organic solvents were mixed together using an orbital mixer at 1000 rpm. After mixing, the mixture is milled in a three-roll mill for a few minutes to obtain a homogeneous paste.

Example 8

4-14 wt % of graphene Grade B and 90-95 wt % of organic solvents were mixed together by ultra-sonication followed by high shear mixing, yielding a homogeneous ink.

Example 9

1-5 wt % of graphene Grade B and 95-98 wt % of organic solvents were mixed together by ultra-sonication followed by high shear mixing, yielding a homogeneous ink.

Example 10

1-5 wt % of Graphene Grade B and 95-98 wt % water were mixed together by ultra-sonication followed by high shear mixing, yielding an aqueous-based homogeneous ink.

All of the graphene ink compositions in Examples 1-10 are summarized in Table 2. These graphene ink formulations were prepared by mixing the ingredients and tested in accordance with the procedures described above. The properties of these graphene inks, including viscosity, adhesion of dried graphene inks on PET substrates and corresponding sheet resistance values of dried inks are summarized in Table 3. Viscosities of these graphene inks range between 5 to 70000 cP and can be used for various applications. Example 1 to Example 8 are highly suitable for stencil and screen printing applications, while Example 9 and Example 10 are suitable for ink-jet printing and spraying applications.

Figure 5:
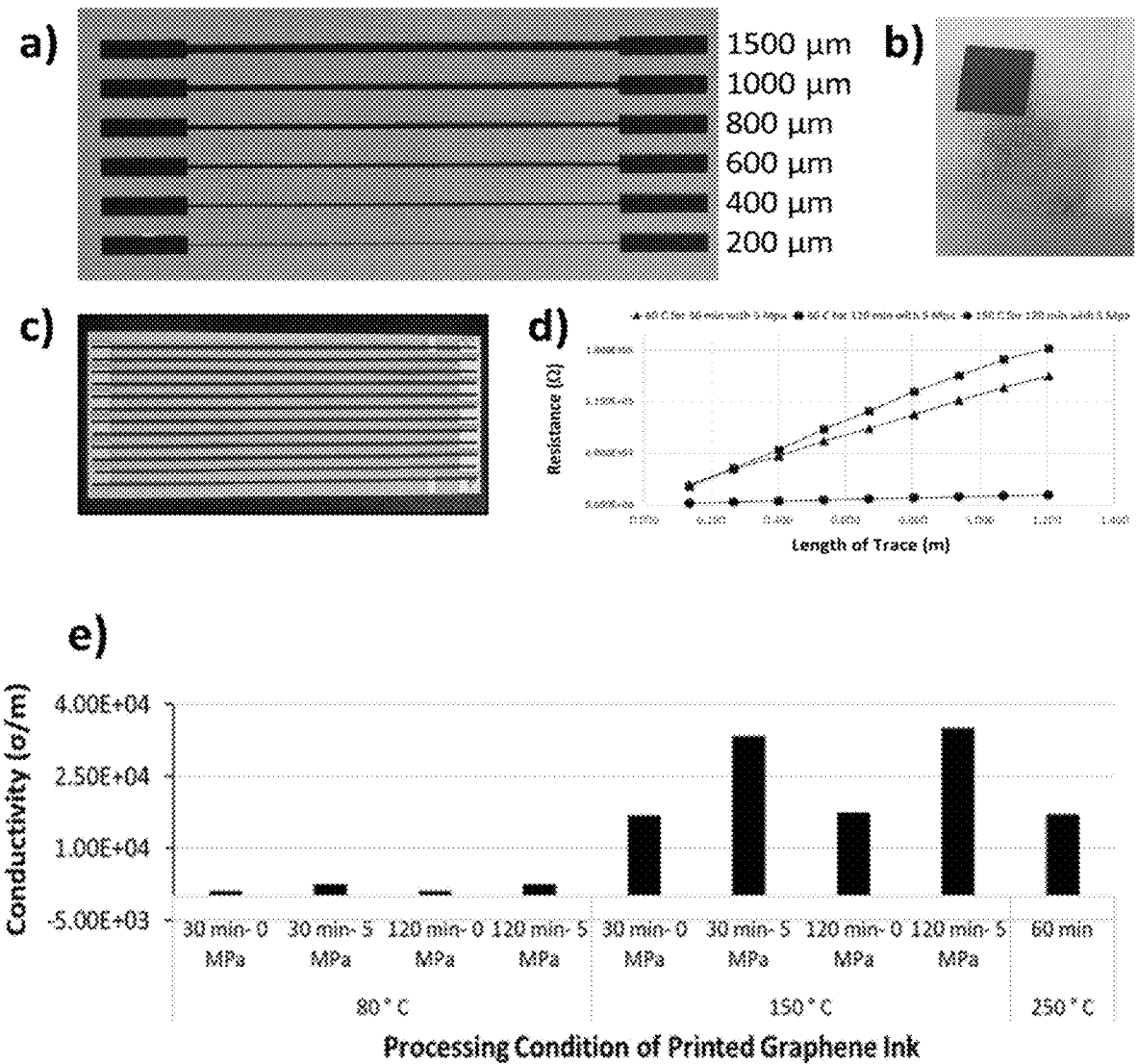
FIG. 5(a) depicts an optical micrograph of a screen printed and thermally cured line pattern of graphene ink prepared in accordance with Example 3 on flexible PET substrate.
FIG. 5(b) depicts an optical micrograph of a adhesion test result (Scratch test) of printed and thermally cured graphene ink prepared in accordance with Example 4 on flexible PET substrate.
FIG. 5(c) depicts optical micrograph of printed and thermally cured electrical conductivity test patterns of graphene ink on rigid FR4 substrate.
FIG. 5(d) depicts the variation of electrical resistance of the graphene ink of Example 1 as function of trace length under different processing conditions.
FIG. 5(e) depicts electrical conductivity data (bar diagrams) of graphene ink of Example 1 under different processing conditions.

These formulated graphene inks can be applied on diverse substrates (rigid PCBs, FR4 to flexible e.g. PET, PC, PI etc.) by various application methods, including, for example, screen and stencil printing, jetting, dispensing and spraying. For example, an optical micrograph of a screen-printed test pattern using graphene ink of Example 3 on PET substrate is shown in FIG. 5(a), while FIG. 5(b) shows the adhesion test results of graphene ink Example 4 on PET. The adhesion of all these graphene inks on PET was found to vary between 2B and 4B as per ASTM D3359 method and are summarized in Table 3. Surface resistances of printed and cured or dried inks are measured by applying current through the known area of the printed graphene inks using a multimeter. Sheet resistance values of these inks also vary from about 5-15 SI/sq/mil and are summarized in Table 3.

the pads were connected to the Agilent 34411A multimeter to measure the resistance. Using the resistance value and dimensions of the printed lines, bulk resistivity (ρ), sheet resistance ($R_s$) and electrical conductivity (C) were obtained using the formula given below:

Bulk resistivity, ρ=R×A/l,

Sheet resistance, Rs=R×W/l

R=Resistance of the printed and cured graphene ink

A=width (W)×thickness (t) (of the printed cured line)

l=length of the printed cured line

W=width of the printed cured line

Electrical conductivity (σ)=l/ρ

Table 4 and FIG. 5(e) show the variation in electrical conductivity with respect to different processing conditions i.e., temperature, pressure, time or their combinations. These results indicate that the combinations of temperature and pressure are the key processing parameters for improving electrical conductivities of graphene inks.

TABLE 2

| Constituents | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|
| Graphene Grade A | — | — | 10-30% | 10-30% | 10-30% | 1-25% | — | — | — | — |
| Graphene Grade B | 4-14% | 5-15% | — | — | 1-10% | — | — | 4-14% | 1-5% | 1-5% |
| Graphene Grade C | — | — | — | 1-10% | — | — | — | — | — | — |
| Graphite | — | — | — | — | — | 1-25% | 10-30% | — | — | — |
| Carbon Black | — | — | 1-10% | 1-10% | 1-10% | 1-10% | 1-20% | — | — | — |
| Organic Solvents | 90-95% | 80-95% | 40-80% | 40-80% | 40-80% | 20-30% | 40-80% | 90-95% | 95-98% | — |
| Water | — | — | — | — | — | — | — | — | — | 95-98% |
| "Novel Polymer Binder" | — | 0.1-10% | 5-20% | 5-20% | 5-20% | 5-20% | 5-20% | — | — | — |
| Surfactants | 0.1-1.5% | 0.1-1.5% | 0.1-1.5% | 0.1-1.5% | 0.1-1.5% | 0.1-1.5% | 0.1-1.5% | — | 0.1-2% | 0.1-2% |
| Rheology Modifiers | — | — | 0.02-0.1% | 0.02-0.1% | 0.02-0.1% | 0.02-0.1% | 0.02-0.1% | — | — | — |
| Functional Additives | — | — | 0.02-0.1% | 0.02-0.1% | 0.02-0.1% | 0.02-0.1% | 0.02-0.1% | — | — | — |

TABLE 3

| Graphene Ink No | Viscosity of the Ink (cP) @ 5 rpm in DV-III Brookfield viscometer @ 25° C. | Adhesion Test Results | Sheet Resistance (Ω/sq/mil) |
|---|---|---|---|
| Example 1 | 10000-30000 | 2B | <10 |
| Example 2 | 15000-40000 | 2B | <10 |
| Example 3 | 20000-50000 | 4B | <10 |
| Example 4 | 20000-50000 | 4B | <10 |
| Example 5 | 20000-70000 | 3B | <10 |
| Example 6 | 15000-40000 | 4B | <20 |
| Example 7 | 10000-30000 | 4B | <20 |
| Example 8 | 10000-30000 | 2B | <10 |
| Example 9 | 5-500 | 3B | — |
| Example 10 | 5-500 | 3B | — |

One of the fascinating features of these graphene inks are their high electrical conductivities that can be tuned by various processing conditions. A low temperature manufacturing process is one of the prime requirements for flexible electronics. To demonstrate the application feasibility of graphene inks for flexible device manufacturing, the graphene ink of Example 1 was printed, dried and additionally post-treated at various processing conditions and measured electrical properties. Test patterns were manually stencil printed on FR4 substrates using the graphene ink of Example 1 and dried at 80, 150 and 250° C. for 30, 60 and 120 minutes in an air oven. Several of these dried samples were pressed at 5 MPa pressure using a laboratory press. For example, FIG. 5(c) shows an optical image of a printed and cured electrical conductivity test pattern of the graphene ink on an FR4 test sample, while FIG. 5(d) shows a typical Resistance vs. Length of test trace (corresponding processing conditions including temperature, pressure, time or their combinations are indicated in the figure).

The electrical conductivity, resistivity and sheet resistance of these test samples were measured using the four-probe method as described below:

All the electrical conductivity measurements were carried out with an Agilent 34411A multimeter. Wires soldered on

TABLE 4

| Curing Temperature | Curing Time | Pressure | Conductivity (σ/m) | Resistivity (Ω · m) |
|---|---|---|---|---|
| 80° C. | 30 min | No Pressure | 1.16E+03 | 8.60E−04 |
| 80° C. | 30 min | 5 MPa for 10 min | 2.47E+03 | 4.04E−04 |
| 80° C. | 120 min | No Pressure | 1.18E+03 | 8.44E−04 |
| 80° C. | 120 min | 5 MPa for 10 min | 2.59E+03 | 3.87E−04 |
| 150° C. | 30 min | No Pressure | 1.69E+04 | 5.90E−05 |
| 150° C. | 30 min | 5 MPa for 10 min | 3.34E+04 | 3.00E−05 |
| 150° C. | 120 min | No Pressure | 1.75E+04 | 5.72E−05 |
| 150° C. | 120 min | 5 MPa for 10 min | 3.50E+04 | 2.86E−05 |
| 150° C. for 120 min + 250° C. for 60 min | | No Pressure | 1.70E+04 | 5.88E−05 |

The present invention describes metal ink formulations, where several types of metal fillers (metal filler A-D) are used alone or in combinations with graphene in suitable ink vehicles.

TABLE 5

| Composition | Metal Filler-A Micron Sized Silver Flakes | Metal Filler-B Nano Silver | Metal Filler-C Micron Sized Silver coated Cu Flakes | Metal Filler-D Micron Sized Silver coated CuNiZn Flakes |
|---|---|---|---|---|
| Particle Size Distribution (D50, µm) | 2-10 | 0.01-0.2 | 2-10 | 2-10 |
| Surface Area ($m^2/g$) | 0.3-2 | 0.5-5 | 0.3-2 | 0.3-2 |
| Tape Density (g/cc) | >2.5 | >1 | >2.5 | >2.5 |
| Organic Coating (wt %) | 0.2-0.8 | 0.3-3 | 0.2-0.8 | 0.2-0.8 |

The organic coatings for Metal Fillers A to D are purchased from commercial suppliers. These organic coatings may comprise either long chain carboxylate and/or amine and/or amide and/or alcohol functional groups or polymers containing carboxylate and/or amine and/or amide and/or alcohol functional groups.

Metal ink formulations described herein contain organic ink vehicle and conducting metal filler particles solely or in combination with graphene. Organic ink vehicles may contain the unique polymer binder described herein, solvents, surfactants, rheology modifiers and functional additives. The size and shape distribution of the metal fillers are the key for formulating highly electrically conductive metal inks, while the addition of nano-sized silver particles or organo-silver compounds can also enhance the electrical conductivities of metal inks. Silver coated copper and copper alloy particles (such as CuNi, CuZn and CuNiZn) and silver coated graphene or graphite flakes can also be used solely or in combination with metal filler particles to formulate low-cost metal inks. Graphene flakes (alone or in combination) can also be used in metal ink formulations to improve mechanical, flexible and barrier properties of metal inks.

Table 5 summarizes the characteristics of different types of metal fillers A to D that were used for formulating metal inks in accordance with the present invention.

The polymeric binder system may contain homo-polymers or co-polymers of thermoplastic resins (25-100 wt %) along with polyester resin (1-50 wt %) and/or phenoxy resin (1-20 wt %) and/or mixtures of thermoset network forming resins (1-50 wt %).

The organic solvent system may contain one or more mixtures of ethylene glycol, propylene glycol, dipropylene glycol, 1,3-butane diol, 2,5-dimethyl-2,5-hexane diol, ethylene glycol monobutyl ether, diethylene glycol mono-n-butyl ether, propylene glycol n-propyl ether, terpineol, ketones such as cyclohexanone, isophorone, C11-ketone, acetates such as butyl carbitol acetate, glycol ether acetates, carbitol acetate, various dibasic esters and propylene carbonate.

The surfactants may comprise one or more SPAN® 80 (available from Sigma-Aldrich), SPAN® 20 (available from Sigma-Aldrich), Tween® 80 (available from Sigma-Aldrich), Triton™ X-100 (available from Sigma-Aldrich), Sorbitan, IGEPAL® CA-630 (available from Sigma-Aldrich), Nonidet P-40 (available from Sigma-Aldrich), Cetyl alcohol, Capstone® FS-3100 (available from Chemours™), Masurf® FS-2800 (available from Pilot Chemical), Masurf® FS-2900 (available from Pilot Chemical), Masurf® FS-230 (available from Pilot Chemical), and Capstone® FS-30 (available from Chemours™).

The rheology modifier may comprise one or mixture of THIXCIN® R (available from Elementis Specialties), Crayvallac® Super (available from Everchem Specialty Chemicals), Brij® 35, Brij® 58, Brij® L4, Brij® 020, Brij® S100, Brij® 93, Brij® C10, Brij® O10, Brij® L23, Brij® O10, Brij® S10 and Brij® S20 (all available from Sigma-Aldrich). Functional additives may comprise one or mixture of a de-foamer, a de-tackifier, slip additives, anti-sag agent and leveling agents, like BYK-UV 3500, BYK-UV 3505, BYK-077, BYK-UV 3530, BYK-S 781, BYK-S 782, BYK-A 535 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins), Additol® LED 01 (available from Allnex) and synthetic polymers like polyamide, polyester and aramid.

Metal ink formulation examples are described below:

Example 11

40-55 wt % of metal filler A, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 12

30-55 wt % of metal filler A, 0.1-25 wt % of metal filler B, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 13

40-55 wt % of metal filler C, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 14

20-45 wt % of metal filler A, 5-35 wt % of metal filler C, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 15

40-55 wt % of metal filler D, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 16

20-45 wt % of metal filler A, 5-35 wt % of metal filler D, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 17

20-55 wt % of metal filler A, 0.1-20 wt % of organo-silver compounds, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

Example 18

20-55 wt % of metal filler A, 0.1-20 wt % of graphene, 8-18 wt % of polymer binder, 0.2-1.5 wt % of surfactants, 0.1-1 wt % of rheology modifiers, 0.1-1 wt % of functional additives and 35-45 wt % of organic solvents were mixed together using an orbital mixer at 1000 rpm. After mixing, the mixture is milled in a three-roll mill for a few minutes to obtain a homogeneous paste.

These examples of metal ink compositions 11-18 are summarized in Table 6. These metal ink formulations were prepared by mixing the ingredients and tested as per the procedures described above. Viscosities of these metal inks range between 5000 and 20000 cP and can be used for various applications, such as stencil and screen printing and dispensing applications. These formulated metal inks can be applied on diverse substrates (including, for example, rigid PCBs, FR4 to flexible e.g. PET, PC, PI etc.) by various printing methods as described above.

Figure 6:
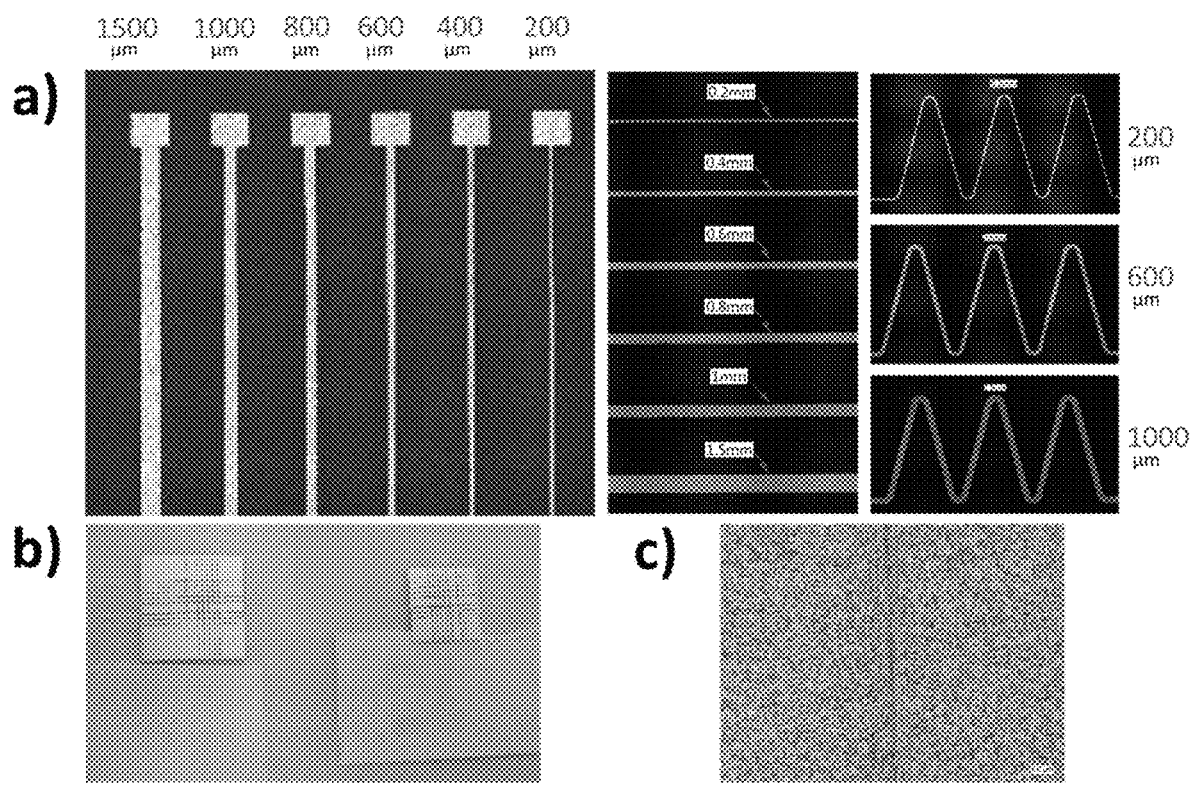
FIG. 6(a) depicts optical micrograph of a screen-printed and thermally cured test pattern of the metal ink prepared in accordance with Example 11.
FIG. 6(b) depicts an adhesion test sample (Scratch test) of the thermally cured metal ink of Example 11.
FIG. 6(c) depicts a pencil hardness test sample of thermally cured metal ink of Example 11 on flexible PET substrates.

For example, an optical micrograph of a screen-printed test pattern using the metal ink of Example 11 on PET substrate is shown in FIG. 6(a), which shows that these inks are capable of printing ultra-fine straight line and curved features. FIG. 6(b) shows the adhesion test results of Example 11 on PET. The adhesion of all these metal inks on PET was found to show above 3B as per ASTM D3359 method and are summarized in Table 7. All of the metal inks of Examples 11-18 were tested for pencil hardness, flexibility and RCA abrasion test and the results are summarized in Table 7.

TABLE 6

| Constituents | Ex. 11 | Ex. 12 | Ex. 13 | Ex. 14 | Ex. 15 | Ex. 16 | Ex. 17 | Ex. 18 |
|---|---|---|---|---|---|---|---|---|
| Metal Filler A | 40-55% | 30-55% | — | 20-45% | — | 20-45% | 20-55% | 20-55% |
| Metal Filler B | — | 0.1-25% | — | — | — | — | — | — |
| Metal Filler C | — | — | 40-55% | 5-35% | — | — | — | — |
| Metal Filler D | — | — | — | — | 40-55% | 5-35% | — | — |
| Organo-silver Compounds | — | — | — | — | — | — | 0.1-20% | — |
| Graphene | — | — | — | — | — | — | — | 0.1-20% |
| Organic Solvents | 35-45% | 35-45% | 35-45% | 35-45% | 35-45% | 35-45% | 35-45% | 35-45% |
| "Novel Polymer Binder" | 8-18% | 8-18% | 8-18% | 8-18% | 8-18% | 8-18% | 8-18% | 8-18% |
| Surfactants | 0.2-1.5% | 0.2-1.5% | 0.2-1.5% | 0.2-1.5% | 0.2-1.5% | 0.2-1.5% | 0.2-1.5% | 0.2-1.5% |
| Rheology Modifiers | 0.1-1% | 0.1-1% | 0.1-1% | 0.1-1% | 0.1-1% | 0.1-1% | 0.1-1% | 0.1-1% |
| Functional Additives | 0.1-1% | 0.1-1% | 0.1-1% | 0.1-1% | 0.1-1% | 0.1-1% | 0.1-1% | 0.1-1% |

TABLE 7

| METAL INK | Viscosity of the Ink (cP) @ 5 rpm in DV-III Brookfield viscometer @ 25° C. | Adhesion on PET | Pencil Hardness Test Results | Flexibility Test Results | RCA Abrasion Test Results | Electrical resistivity (mΩ/sq/mil) |
|---|---|---|---|---|---|---|
| Example 11 | 5000-20000 | 5B | >5H | No Cracking, No Flaking, Pass Mandrel Bar $\frac{1}{8}^{th}$ | >100 Test Cycles | <10 |
| Example 12 | 8000-20000 | 3B | >3H | No Cracking, No Flaking, Pass Mandrel Bar $\frac{1}{8}^{th}$ | >100 Test Cycles | <10 |

TABLE 7-continued

| METAL INK | Viscosity of the Ink (cP) @ 5 rpm in DV-III Brookfield viscometer @ 25° C. | Adhesion on PET | Pencil Hardness Test Results | Flexibility Test Results | RCA Abrasion Test Results | Electrical resistivity (mΩ/sq/mil) |
|---|---|---|---|---|---|---|
| Example 13 | 5000-20000 | 3B | >3H | No Cracking, No Flaking, Pass Mandrel Bar 1/8$^{th}$ | >100 Test Cycles | <200 |
| Example 14 | 5000-20000 | 5B | >5H | No Cracking, No Flaking, Pass Mandrel Bar 1/8$^{th}$ | >100 Test Cycles | <30 |
| Example 15 | 5000-20000 | 5B | >5H | No Cracking, No Flaking, Pass Mandrel Bar 1/8$^{th}$ | >100 Test Cycles | <200 |
| Example 16 | 5000-20000 | 5B | >5H | No Cracking, No Flaking, Pass Mandrel Bar 1/8$^{th}$ | >100 Test Cycles | <30 |
| Example 17 | 5000-20000 | 4B | >3H | No Cracking, No Flaking, Pass Mandrel Bar 1/8$^{th}$ | >100 Test Cycles | <20 |
| Example 18 | 5000-20000 | 4B | >5H | No Cracking, No Flaking, Pass Mandrel Bar 1/8$^{th}$ | >100 Test Cycles | <15 |

FIG. 6(c) shows pencil hardness test results of Example 11 on PET, showing above 3H characteristics. Flexibility test results showed no cracking or flaking and all ink formulations of Examples 11-18 passed the Mandrel Bar (1/8$^{th}$) test. Surface resistances of printed and cured or dried inks are measured by applying current through the known area of the printed metal inks using a multimeter and are found to be <100 mΩ/sq/mil and are summarized in Table 7.

The present invention also describes UV-curable metal ink formulations, where several types of metal fillers (metal filler A-D) are used alone or in combinations in suitable ink vehicles. UV-curable metal ink formulations described herein comprise organic ink vehicles and conducting metal filler particles alone or in combinations. Organic ink vehicles may contain different combinations of cross-linkable monomers, dimers, trimers, tetramers, penta- or hexamer and oligomers of acrylic resins having epoxy, polyurethane, polyester, polyether and acrylic backbones or epoxy resins, solvents, functional additives, antioxidants and inhibitors, and UV-curing initiators.

The solvent may comprise one or more mixtures of ethylene glycol, propylene glycol, dipropylene glycol, 1,3-butane diol, 2,5-dimethyl-2,5-hexane diol, ethylene glycol monobutyl ether, diethylene glycol mono-n-butyl ether, propylene glycol n-propyl ether, terpineol, ketones such as cyclohexanone, isophorone, Cl 1-ketone, acetates such as butyl carbitol acetate, glycol ether acetates, carbitol acetate, dibasic esters and propylene carbonate.

Epoxy resins may comprise one or mixture of epoxy resins, such as EPON™ 862 (available from Miller-Stephenson), DYCK-CH, jER 828 (available from Mitsubishi Chemical), 1,4-butanediol diglycidyl ether, 1,6-hexanediol diglycidylether (D.E.R.™ 731 available from Olin™), orho-Cresyl glycidyl ether (D.E.R.™ 723 available from Olin™) and C12-C14 alkyl glycidyl ether (D.E.R.™ 721 available from Olin™).

The epoxy acrylate may comprise one or more mixtures of epoxy backbone based (meth)acrylate such as Ebecryl® 3503 (available from Allnex), Ebecryl® 3201 (available from Allnex), Photomer® 3005 (available from IGM resins), Photomer® 3316 (available from IGM resins), Ebecryl 3411® (available from Allnex), and Ebecryl® 3500 (available from Annex).

The urethane acrylate may comprise one or more mixtures of urethane backbone based (meth)acrylate such as SUO-2371 (available from Shin-A T&C), SUO-300 (available from Shin-A T&C), SUO-7620 (available from Shin-A T&C), Photomer® 6891 (available from IGM resins), SUO S3000 (available from Shin-A T&C), Ebecryl® 8413 (available from Allnex), Ebecryl® 230 (available from Allnex), Ebecryl® 4833 (available from Allnex), Ebecryl® 8411 (available from Allnex), Ebecryl® 270 (available from Allnex), Ebecryl® 8804 (available from Allnex), and Photomer® 6628 (available from IGM resins).

The polyester acrylate may comprise one or more mixtures of polyester backbone based (meth)acrylate such as Photomer® 4006 (available from IGM resins), Ebecryl® 450 (available from Allnex), Ebecryl® 812 (available from Allnex), and Photomer® 5429 (available from IGM resins).

The siloxane acrylate may comprise one or more mixtures of siloxane backbone bazed (meth)acrylate such as BYK-UV 3570 (available from BYK), BYK-UV 3575 (available from BYK), BYK-UV 3535 (available from BYK), BYK-UV 3530 (available from BYK), BYK-UV 3505 (available from BYK), BYK-UV 3500 (available from BYK), Ebecryl® 350 (available from Allnex), Ebecryl® 1360 (available from Allnex), and SUO-S3000 (available from Shin-A T&C).

The aliphatic acrylate may comprise one or more mixtures of hydrocarbon backbone based (meth)acrylate such as Ebecryl® 1300 (available from Allnex), SAP-M3905 (available from Polygon), Ebecryl® 525 (available from Annex), and SAP-7700HT40 (available from Shin-A T&C).

The polyether acrylate may contain one or more mixtures of polyether backbone based (meth)acrylate such as Photomer® 4211 (available from IGM resins), Photomer® 4039 (available from IGM resins), Photomer® 4094 (available from IGM resins), Ebecryl® 110 (available from Allnex), and Photomer® 4158 (available from IGM resins).

Functional additives may comprise one or mixture of de-foamer, de-tackifier, slip additives, anti-sag agent and leveling agents, such as BYK-UV 3500, BYK-UV 3505, BYK-077, BYK-UV 3530, BYK-S 781, BYK-S 782, BYK-A 535 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins), Additol® LED 01 (available from Allnex) and synthetic polymers like polyamide, polyester and aramid.

The UV catalyst may comprise one or mixture of commercially available photoinitiators such as, Irgacure® 184 (1-hydroxy-cyclohexyl-phenyl-ketone), Irgacure 819® (bis (2,4,6-trimethylbenzoyl)-phenylphosphineoxide), Irgacure® 1850 (a 50/50 mixture of bis(2,6-dimethoxybenzoyl)-2,4,4-trimethylpentyl-phosphine oxide and 1-hydroxy-cyclohexyl-phenyl-ketone), Darocur® MBF (a pheny glyoxylic acid methyl ester) and Darocur® 4265 (50/50 mixture of diphenyl (2,4,6-trimethylbenzoyl)-phosphine oxide and 2-hydroxy-2-methyl-1-phenyl-propan-1-one, a mixture of phosphine oxide), Irgacure® 2022 (a mixture of Irgacure® 819 (phosphine oxide, phenyl bis(2,4,6-trimethyl benzoyl)) (20 wt %), and Darocur® 1173 (2-hydroxy-2-methyl-1-phenyl-1-propanone) (80 wt %)) and 2-hydroxy-2-methyl-1-phenyl-propan-1-one), Irgacure® 1700 (a 25/75 mixture of bis(2,6-dimethoxybenzoyl)-2,4,4-trimethylpentyl-phosphine oxide and 2-hydroxy-2-methyl-1-phenylpropan-1-one), Irgacure® 907 (2-methyl-1[4-(methylthio)phenyl]-2-morpholonopropan-1-one).

Metal Fillers A-D may be used alone or in combination.

UV-curable metal ink formulation examples 19-21 are disclosed below:

Example 19

3-15 wt % of urethane acrylate, 0.2-2 wt % of polyester acrylate, 1-7 wt % siloxane acrylate, 2-10 wt % aliphatic acrylate, 0.1-5 wt % polyether acrylate, 0.1-5 wt % functional additives, 0.1-5 wt % UV catalyst, 40-90 wt % metal filler and 0-20 wt % solvent mixtures were mixed together by high shear mixing, yielding a homogeneous ink.

Example 20

1-15 wt % epoxy acrylate, 2-10 wt % urethane acrylate, 1-7 wt % polyester acrylate, 3-10 wt % aliphatic acrylate, 4-15 wt % polyether acrylate, 0.1-5 wt % functional additives, 0.1-5 wt % UV catalyst, 40-90 wt % metal filler and 0-20 wt % solvent mixtures were mixed together by high shear mixing, yielding a homogeneous ink.

Example 21

5-50 wt % epoxy resins, 0.1-5 wt % functional additives, 0.1-10 wt % UV catalyst, 40-90 wt % metal filler and 0-20 wt % solvent mixtures were mixed together by high shear mixing. After mixing, the mixture is milled in a three-roll mill for a few minutes to obtain a homogeneous paste.

Examples of the UV-curable metal ink compositions are summarized in Table 8. These UV-curable metal ink formulations were prepared by mixing the ingredients and tested as per the procedures described above. Viscosities of these metal inks ranged between 2000 and 10000 cP and can be used for various applications, such as stencil and screen printing and dispensing applications. These formulated metal inks can be applied on diverse substrates (rigid PCBs, FR4 to flexible e.g. PET, PC, PI etc.) by various printing methods as described above.

Figure 7:
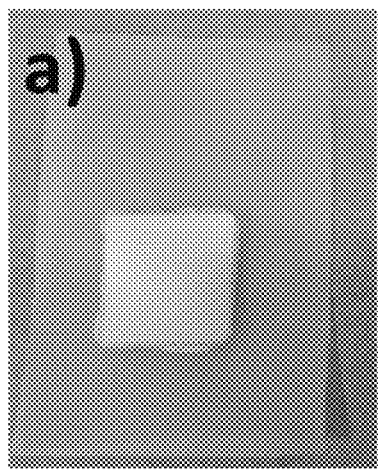
FIG. 7(a) depicts an optical micrograph of a stencil-printed and UV cured test pattern of the UV-curable metal ink prepared in accordance with Example 21 on a flexible PET substrate.
FIG. 7(b) depicts an optical micrograph of a stencil-printed and UV cured electrical conductivity test patterns of the UV-curable metal ink of Example 21 on a FR4 substrate.
Figure 7:
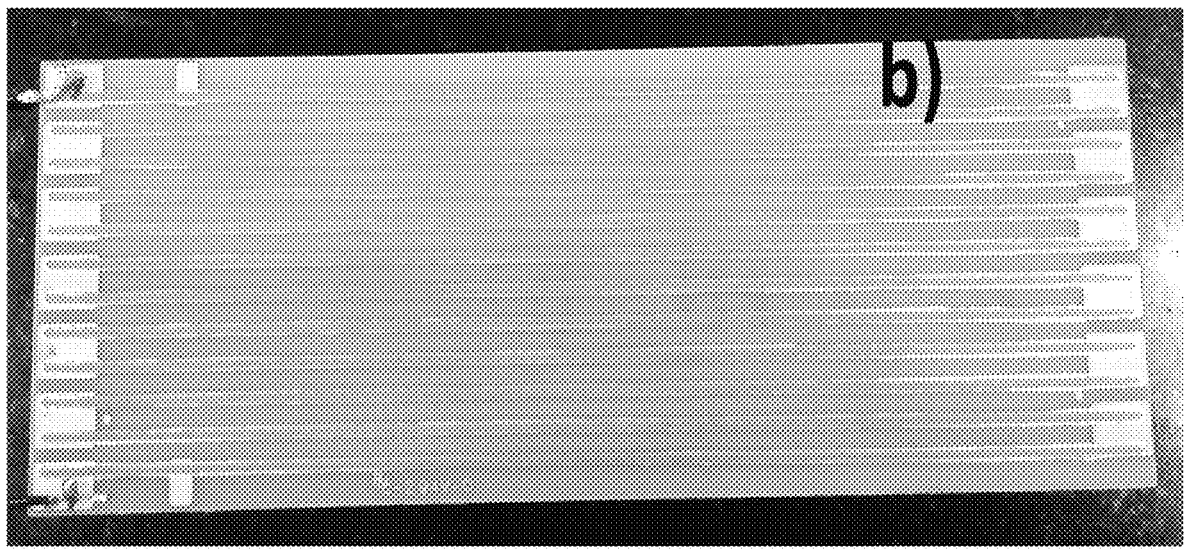

For example, an optical micrograph of a stencil-printed and UV-cured test pattern of Example 21 on PET substrate is shown in FIG. 7(a). FIG. 7(b) shows an optical micrograph of a UV-cured electrical conductivity test patterns of Example 21 on a FR4 substrate. The adhesion of all these metal inks on PET were found to show greater than 3B as per ASTM D3359 method and are summarized in Table 9. Surface resistances of printed and UV cured inks were measured by applying current through the known area of the printed metal inks using a multimeter and were found to be <100 mΩ/sq/mil and are summarized in Table 9.

TABLE 8

| Constituents | Example 19 | Example 20 | Example 21 |
| --- | --- | --- | --- |
| Solvent Mixtures | 0-20% | 0-20% | 0-20% |
| Epoxy Resins | — | — | 5-50% |
| Epoxy Acrylate | — | 1-15% | — |
| Urethane Acrylate | 3-15% | 2-10% | — |
| Polyester Acrylate | 0.2-2% | 1-7% | — |
| Siloxane Acrylate | 1-7% | — | — |
| Aliphatic Acrylate | 2-10% | 3-10% | — |
| Polyether Acrylate | 0.1-5% | 4-15% | — |
| Functional Additives | 0.1-5% | 0.1-5% | 0.1-5% |
| UV catalyst | 0.1-5% | 0.1-5% | 0.1-10% |
| Metal Filler | 40-90% | 40-90% | 40-90% |

TABLE 9

| UV Curable Metal Ink | Viscosity of the Ink (cP) @ 5 rpm in DV-III Brookfield Viscometer @ 25° C. | Adhesion | Electrical resistivity (mΩ/sq/mil) |
| --- | --- | --- | --- |
| Example 19 | 3000-10000 | >3B | <100 |
| Example 20 | 3000-10000 | >3B | <100 |
| Example 21 | 1000-8000 | >3B | <100 |

The present invention also discloses dielectric ink formulations, where the functionality of the cured polymeric matrix can be controlled by the judicious selection of appropriate combinations of different functional resins and optimization of their reactivity. Dielectric inks may contain different combinations of cross-linkable monomer, dimer, trimer, tetramer, penta- or hexamer and oligomers of acrylic resins having epoxy, polyurethane, polyester, polyether and acrylic backbones, solvents, functional additives, antioxidants and inhibitors, colouring agents, dyes and pigments, UV-curing initiators, thermal curing initiators, organic and inorganic fillers. Properties of the cured polymeric matrix can be controlled by varying the proportion of different acrylate resins having epoxy, polyurethane, polyester, polyether and acrylic backbones. These dielectric polymeric compositions are highly flexible, slightly stretchable, have excellent adhesion to flexible substrates, superior weather resistance (moisture, gas and chemical resistant) and excellent dielectric properties.

Carbon-carbon bonded thermoplastic resins may comprise one or mixture of homo or co-polymers of either allyl or vinyl, or (meth)acrylate, such as polybutyl methacrylate, polypyrrolidone, and polyvinylacetate.

Polyurethane resins may comprise one or mixture of a thermoplastic polyurethane, such as Desmocoll® 400 and Desmomelt® 540 (both available from Covestro).

Epoxy resins may comprise one or a mixture of epoxy resins, such as EPON™ 862 (available from Miller-Stephenson), DYCK-CH, jER 828 (available from Mitsubishi Chemical), 1,4-butanediol diglycidyl ether, 1,6-hexanediol diglycidylether (D.E.R.™ 731 available from Olin™), orho-Cresyl glycidyl ether (D.E.R.™ 723 available from Olin™) and C12-C14 alkyl glycidyl ether (D.E.R.™ 721 available from Olin™). Solvent mixtures may comprise one or more of ethylene glycol, propylene glycol, dipropylene glycol, 1,3-butane diol, 2,5-dimethyl-2,5-hexane diol, ethylene glycol monobutyl ether, diethylene glycol mono-n-butyl ether, propylene glycol n-propyl ether, terpineol, ketones such as cyclohexanone, isophorone, C11-ketone, acetates such as butyl carbitol acetate, glycol ether acetates, carbitol acetate, various dibasic esters, and propylene carbonate.

The epoxy acrylate may comprise one or more of epoxy backbone based (meth)acrylates such as Ebecryl® 3503 (available from Allnex), Ebecryl® 3201 (available from Allnex), Photomer® 3005 (available from IGM resins), Photomer® 3316 (available from IGM resins), Ebecryl 3411® (available from Allnex), and Ebecryl® 3500 (available from Allnex).

The urethane acrylate may comprise one or more of a urethane backbone based (meth)acrylate such as SUO-2371 (available from Shin-A T&C), SUO-300 (available from Shin-A T&C), SUO-7620 (available from Shin-A T&C), Photomer® 6891 (available from IGM resins), SUOS3000 (available from Shin-A T&C), Ebecryl® 8413 (available from Allnex), Ebecryl® 230 (available from Allnex), Ebecryl® 4833 (available from Allnex), Ebecryl® 8411 (available from Allnex), Ebecryl® 270 (available from Allnex), Ebecryl® 8804 (available from Allnex), and Photomer®6628 (available from IGM resins).

The polyester acrylate may comprise one or more of polyester backbone based (meth)acrylate such as Photomer®4006 (available from IGM resins), Ebecryl® 450 (available from Allnex), Ebecryl® 812 (available from Allnex), and Photomer® 5429 (available from IGM resins). The siloxane acrylate may comprise one or more of siloxane backbone based (meth)acrylate such as BYK-UV 3570 (available from BYK), BYK-UV 3575 (available from BYK), BYKUV-3535 (available from BYK), BYK-UV 3530 (available from BYK), BYK-UV 3505 (available from BYK), BYK-UV 3500 (available from BYK), Ebecryl® 350 (available from Allnex), Ebecryl® 1360 (available from Allnex), and SUO-S3000 (available from Shin-A T&C).

The aliphatic acrylate may comprise one or more of hydrocarbon backbone based (meth)acrylate such as Ebecryl® 1300 (available from Allnex), SAP-M3905 (available from Polygon), Ebecryl® 525 (available from Allnex), and SAP-7700 HT40 (available from Shin-A T&C).

The polyether acrylate may comprise one or more of polyether backbone based (meth)acrylate such as Photomer® 4211 (available from IGM resins), Photomer® 4039 (available from IGM resins), Photomer® 4094 (available from IGM resins), Ebecryl® 110 (available from Allnex), and Photomer® 4158 (available from IGM resins).

Functional additives may comprise one or a mixture of a de-foamer, a de-tackifier, slip additives, anti-sag agent and leveling agents, such as BYK-UV 3500, BYK-UV 3505, BYK-077, BYK-UV 3530, BYK-S 781, BYK-S 782, BYK-A 535 (all available from BYK), Capstone® FS-34 (available from Chemours™), Capstone® FS-3100 (available from Chemours™), Modaflow® 2100 (available from Allnex), Omnistab® LS 292 (available from IGM resins), Omnivad®-1116 (available form IGM Resins), Additol® LED 01 (available from Allnex) and synthetic polymers like polyamide, polyester and aramid. The thermal catalyst may comprise one or a mixture of thermal curing initiators such as azobisisobutyronitrile (AIBN), 2,2'-azobis(2-methylbutyronitrile), 2,2'-azobis(2-methylpropionamidine) dihydrochloride, dicumyl peroxide, benzoyl peroxide and tert-butyl peroxide.

The UV catalyst may comprise one or a mixture of commercially available photoinitiators such as, Irgacure®184 (1-hydroxy-cyclohexyl-phenyl-ketone), Irgacure® 819 (bis (2,4,6-trimethylbenzoyl)-phenylphosphineoxide), Irgacure® 1850 (a 50/50 mixture of bis(2,6-dimethoxybenzoyl)-2,4,4-trimethylpentyl-phosphine oxide and 1-hydroxy-cyclohexyl-phenyl-ketone), Darocur® MBF (a pheny glyoxylic acid methyl ester) and Darocur® 4265 (50/50 mixture of diphenyl (2,4,6-trimethylbenzoyl)-phosphine oxide and 2-hydroxy-2-methyl-1-phenyl-propan-1-one, a mixture of phosphine oxide), Irgacure® 2022 (a mixture of Irgacure® 819 (phosphine oxide, phenyl bis(2, 4,6-trimethyl benzoyl)) (20 wt %), and Darocur® 1173 (2-hydroxy-2-methyl-1-phenyl-1-propanone) (80 wt %)) and 2-hydroxy-2-methyl-1-phenyl-propan-1-one), Irgacure® 1700 (a 25/75 mixture of bis(2,6-dimethoxybenzoyl)-2,4,4-trimethylpentyl-phosphine oxide and 2-hydroxy-2-methyl-1-phenylpropan-1-one), and Irgacure® 907 (2-methyl-1 [4-(methylthio)phenyl]-2-morpholonopropan-1-one).

Dyes and pigments may be present as one or more colouring agents such as anthraquinone dyes, azo dyes, acridine dyes, cyanine dyes, diazonium dyes, nitro dyes, nitroso dyes, quinone dyes, xanthene dyes, fluorene dyes and rhodamine dyes and/or their (meth)acrylated version. Pigment may also be used as coloring agents which may be dispersed in (meth)acrylate compounds. The dyes and pigment may be used alone or in combination to impart the colour.

The filler may comprise one or a mixture of mica, silica, talc, alumina, barium titanate, graphene and boron nitride.

Dielectric Ink formulations (Examples 22-29) are disclosed below:

Example 22

15-35 wt % of urethane acrylate, 2-5 wt % polyester acrylate, 5-15 wt % siloxane acrylate, 12-24 wt % aliphatic acrylate, 1-7 wt % polyether acrylate, 1-7 wt % functional additives, 1-7 wt % of UV catalyst, 0-4 wt % of dye and/or pigment and 10-30 wt % of filler were mixed together by high shear mixing to form a homogenous paste.

Example 23

5-20 wt % epoxy acrylate, 30-50 wt % urethane acrylate, 1-10 wt % polyester acrylate, 1-10 wt % aliphatic acrylate, 8-18 wt % polyether acrylate, 1-7 wt % functional additives, 1-7 wt % of UV catalyst and 0-4 wt % of dye and/or pigment were mixed together by high shear mixing to form a homogenous paste.

Example 24

10-25 wt % of urethane acrylate, 5-15 wt % of polyester acrylate, 15-25 wt % of aliphatic acrylate, 20-35 wt % of polyether acrylate, 1-7 wt % functional additives, 1-7 wt % of UV catalyst and 0-4 wt % of dye and/or pigment were mixed together by high shear mixing to form a homogenous paste.

Example 25

10-25 wt % of urethane acrylate, 5-15 wt % of polyester acrylate, 15-25 wt % of aliphatic acrylate, 20-35 wt % of polyether acrylate, 1-7 wt % functional additives, 1-7 wt % of thermal catalyst, 0-4 wt % of dye and/or pigment and 0-5 wt % solvent mixtures were mixed together by high shear mixing to form a homogenous paste.

Example 26

10-25 wt % carbon-carbon bonded thermoplastic resins, 0.5-5 wt % functional additives, 0-4 wt % dye and/or pigment, 10-30 wt % filler and 35-55 wt % solvent mixtures were mixed together by high shear mixing to form a homogenous paste.

Example 27

10-25 wt % carbon-carbon bonded thermoplastic resins, 10-25 wt % polyurethane resins, 0.5-5 wt % functional additives, 0-4 wt % dye and/or pigment, 10-30 wt % filler and 35-55 wt % solvent mixtures were mixed together by high shear mixing to form a homogenous paste.

Example 28

30-50 wt % of epoxy resins, 0.5-5 wt % functional additives, 2-15 wt % thermal catalyst, 5-30 wt % filler and 0-20 wt % solvent mixtures were mixed together by high shear mixing. After mixing, the mixture was milled in a three-roll mill for a few minutes to obtain a homogeneous paste.

Example 29

30-50 wt % of epoxy resins, 0.5-5 wt % functional additives, 2-15 wt % UV catalyst, 5-30 wt % filler and 0-20 wt % solvent mixtures were mixed together by high shear mixing. After mixing, the mixture was milled in a three-roll mill for a few minutes to obtain a homogeneous paste.

These examples of dielectric ink compositions are summarized in Table 10. The ingredients of dielectric inks were mixed together and tested as per the procedures described above. Properties of the dielectric inks such as viscosity and adhesion of cured polymer matrix to PET substrates and dielectric break down voltages are summarized in Table 11.

TABLE 10

| Constituents | Ex. 22 | Ex. 23 | Ex. 24 | Ex. 25 | Ex. 26 | Ex. 27 | Ex. 28 | Ex. 29 |
|---|---|---|---|---|---|---|---|---|
| Carbon-Carbon Bonded Thermoplastic Resins | — | — | — | — | 10-25% | 10-25% | — | — |
| Polyurethane Resins | — | — | — | — | — | 10-25% | — | — |
| Epoxy Resins | — | — | — | — | — | — | 30-50% | 30-50% |
| Solvent Mixtures | — | — | — | 0-5% | 35-55% | 35-55% | 0-20% | 0-20% |
| Epoxy Acrylate | — | 5-20% | — | — | — | — | — | — |
| Urethane Acrylate | 15-35% | 30-50% | 10-25% | 10-25% | — | — | — | — |
| Polyester Acrylate | 2-5% | 1-10% | 5-15% | 5-15% | — | — | — | — |
| Siloxane Acrylate | 5-15% | — | — | — | — | — | — | — |
| Aliphatic Acrylate | 12-24% | 1-10% | 15-25% | 15-25% | — | — | — | — |
| Polyether Acrylate | 1-7% | 8-18% | 20-35% | 20-35% | — | — | — | — |
| Functional Additives | 1-7% | 1-7% | 1-7% | 1-7% | 0.5-5% | 0.5-5% | 0.5-5% | 0.5-5% |
| Thermal Catalyst | — | — | — | 1-7% | — | — | 2-15% | — |
| UV catalyst | 1-7% | 1-7% | 1-7% | — | — | — | — | 2-15% |
| Dye and/or pigment | 0-4% | 0-4% | 0-4% | 0-4% | 0-4% | 0-4% | — | — |
| Filler | 10-30% | — | — | — | 10-30% | 10-30% | 5-30% | 5-30% |

TABLE 11

| Dielectric Ink | Viscosity of the Ink (cP) @ 5 rpm in DV-III Brookfield viscometer @ 25° C. | Adhesion | Dielectric Breakdown Voltage (V) |
|---|---|---|---|
| Example 22 | 5000-15000 | 5B | >500 V |
| Example 23 | 1000-4000 | 5B | >500 V |
| Example 24 | 1000-4000 | 5B | >500 V |

TABLE 11-continued

| Dielectric Ink | Viscosity of the Ink (cP) @ 5 rpm in DV-III Brookfield viscometer @ 25° C. | Adhesion | Dielectric Breakdown Voltage (V) |
| --- | --- | --- | --- |
| Example 25 | 1000-4000 | 5B | >500 V |
| Example 26 | 5000-10000 | 5B | >500 V |
| Example 27 | 5000-15000 | 5B | >500 V |
| Example 28 | 5000-20000 | 5B | >500 V |
| Example 29 | 5000-20000 | 5B | >500 V |

Figure 8:
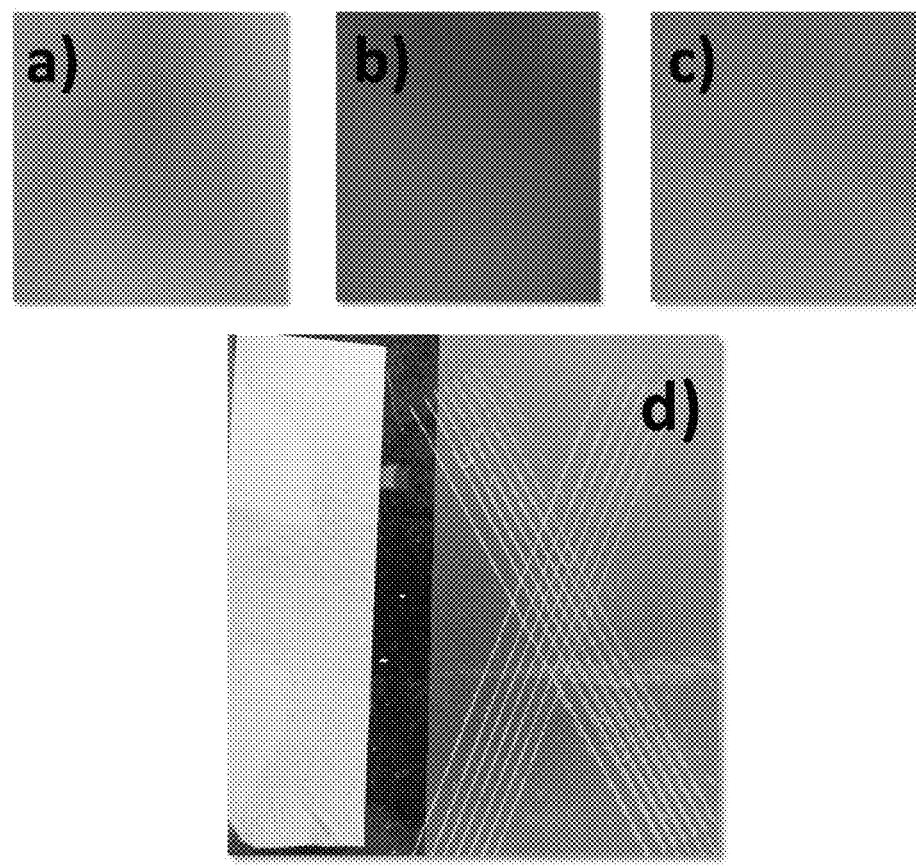
FIGS. 8(a)-(c) depict an optical micrograph of a screen-printed UV-cured test pattern of the dielectric ink of Example 22 with additions of varying types of dyes and/or pigments on flexible PET substrates.
FIG. 8(d) depicts an optical micrograph of a adhesion test sample of dielectric ink of Example 22 on flexible PET substrates.
FIG. 8(e) depicts variations of measured current as a function of applied test voltage of the dielectric ink of Example 22, printed single and double layer on copper test coupon.
Figure 8:
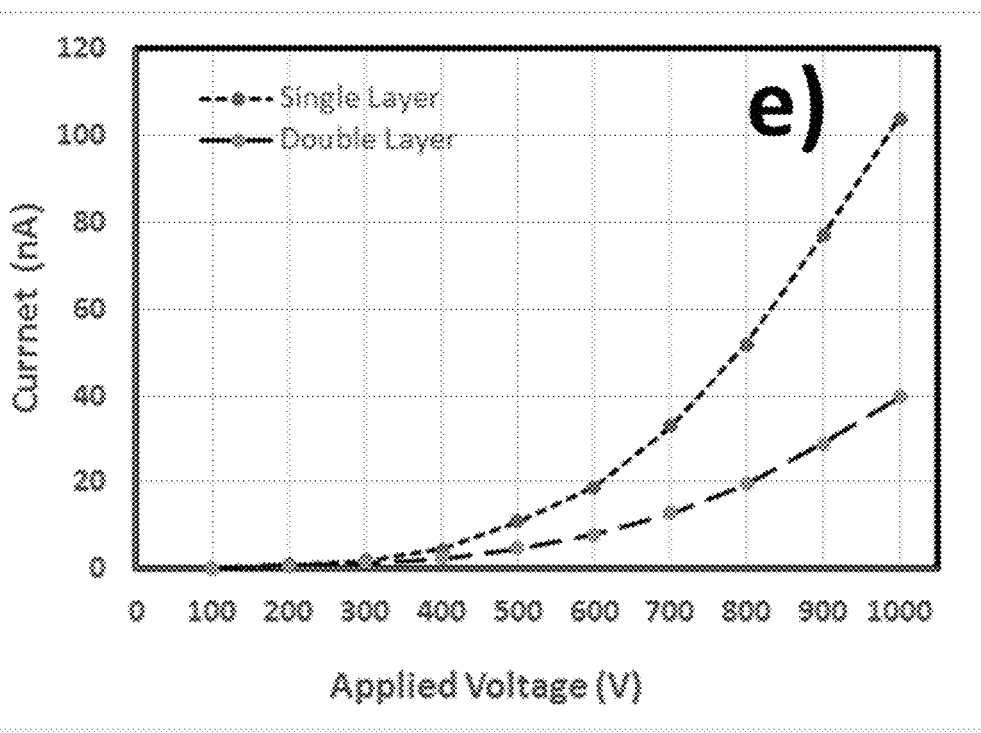

Viscosities of these dielectric inks range between about 1000 and 20000 cP and can be used for various applications, such as stencil and screen printing, dispensing, spraying and jetting applications. These formulated dielectric inks can be applied on diverse substrates (including, for example, rigid PCBs, FR4 to flexible e.g. PET, PC, PI etc.) by various printing methods as described above. For example, an optical micrograph of a screen-printed test pattern of the dielectric ink of example 22 on a PET substrate is shown in FIGS. 8(a-c) with additions of varying types of dyes and/or pigments, while FIG. 8(d) shows the adhesion test results of 5B for Example 22 on PET. The adhesion of all these dielectric inks on PET are found to show 5B as per ASTM D3359 method and are summarized in Table 11. All of the dielectric inks are also tested for dielectric break down voltage and are found to be above 500 V as shown in Table 11. FIG. 8(e) shows the variation of measured current as function of applied test voltage of Example 22, which was printed single and double layer on copper test coupon.

All of the graphene, graphene-carbon, metal and dielectric ink formulations described herein are highly compatible with each other, which is one of the key requirements for MTS and other similar structure fabrications. A systematic stepwise testing process was developed to test the compatibility of these inks.

This includes step-wise 1) screen printing and drying of metal inks followed by, 2) screen printing and drying of graphene-carbon or graphene inks. Dielectric inks are further printed on dried structures, metal inks or multi-layered dried structures of metal/graphene or metal/graphene-carbon inks on PET followed by thermal or UV-curing. Compatibility of metal inks with dielectric inks were also tested by 1) screen printing and thermal or UV-curing of dielectric ink and followed by 2) screen printing and drying of metal inks. Compatibility of these material with substrate and with each other was tested using adhesion testing using ASTM D3359 method. The test patterns were developed in such a way as to allow testing of adhesions (i.e., compatibility) of 1) metal/PET, 2) graphene or carbon-graphene/PET, 3) dielectric/PET, 4) metal/dielectric/PET and 5) metal/graphene or carbon-graphene/dielectric/PET zones. The compatibility is rated on a scale of 0B to 5B, where 0B denotes incompatibility and 5B denotes high compatibility between the various substrates and the inks.

Figure 9A:
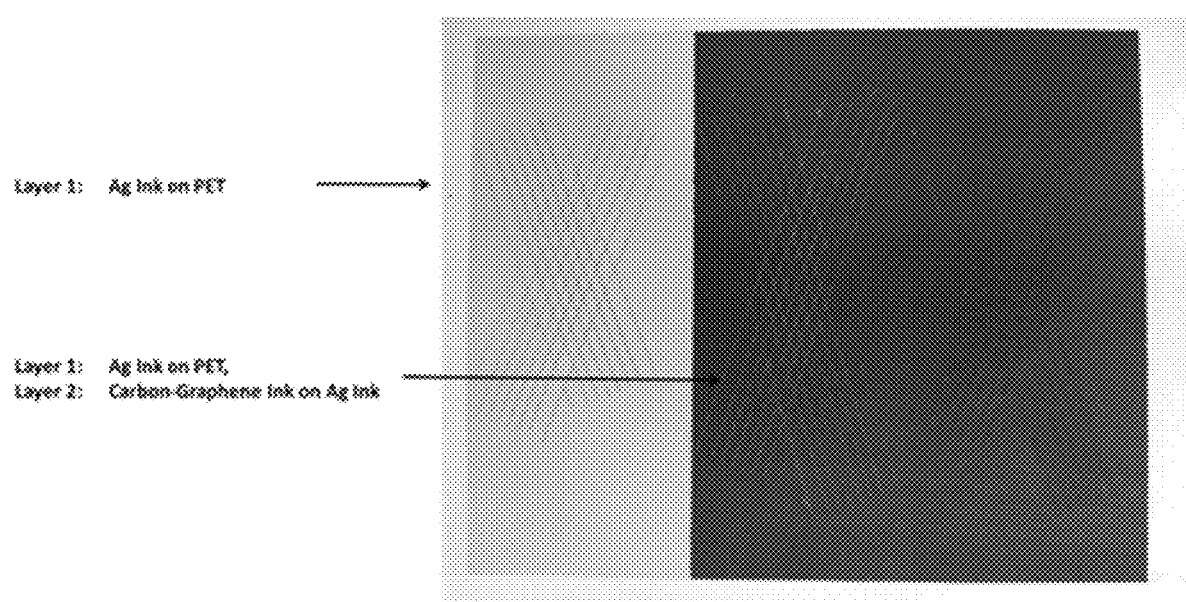
FIG. 9 depicts optical micrographs of compatibility test results of various ink compositions: (a) metal (Example 11) and graphene-carbon (Example 6) inks, (b) metal (Example 15) and dielectric (Example 26) inks, (c) dielectric (Example 22) and metal (Example 12) inks and (d) metal (Example 11), graphene (Example 3) and dielectric (Example 22) inks.
Figure 9B:
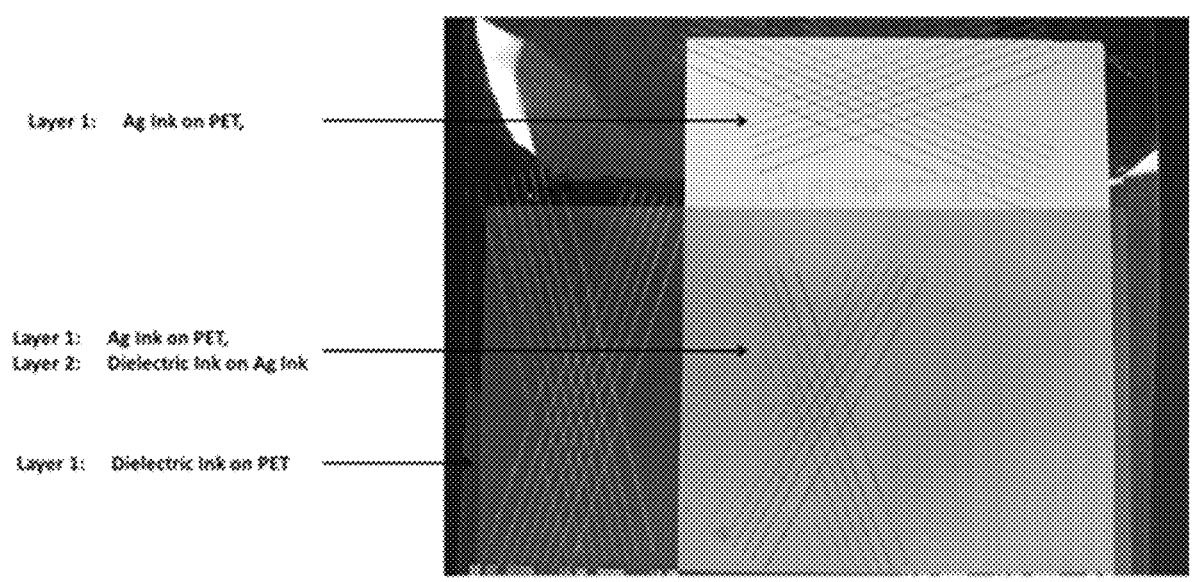
Figure 9C:
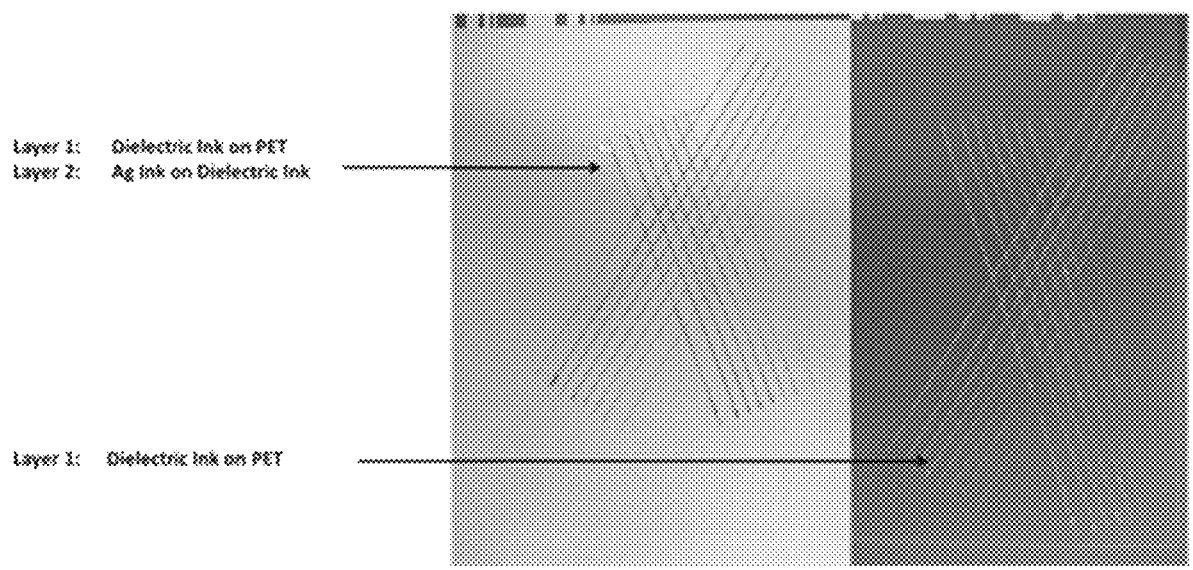
Figure 9D:
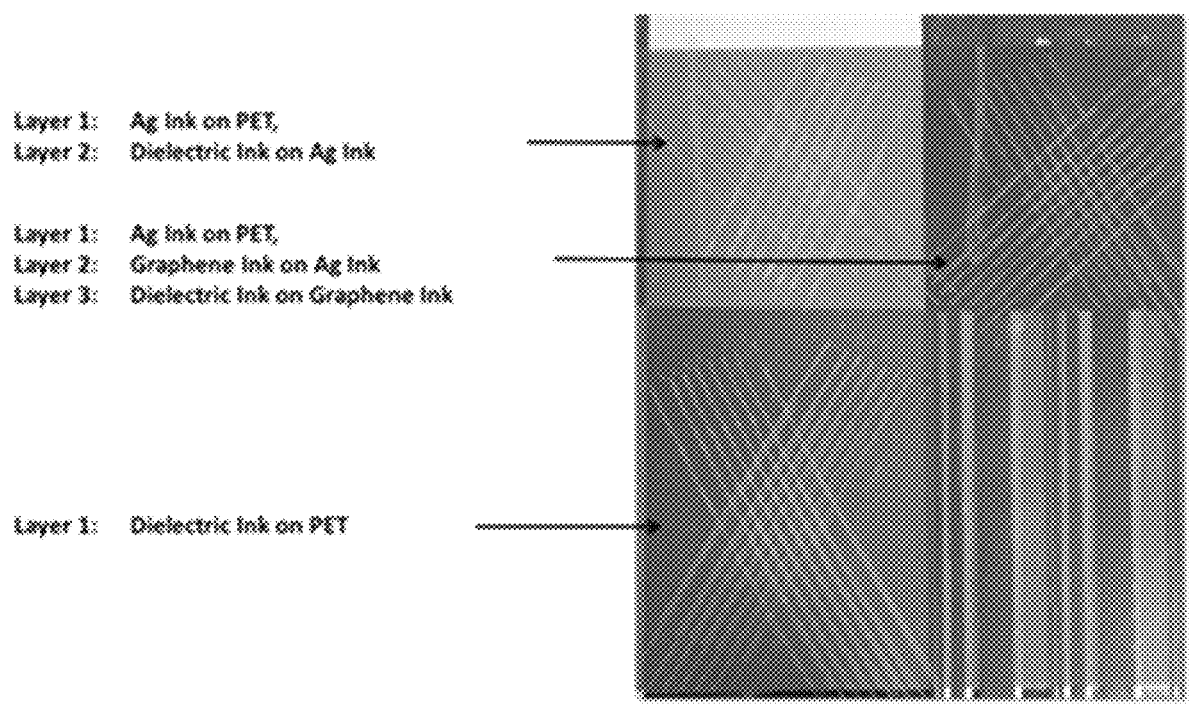

Test results of the compatibility testing results of metal and graphene-carbon ink is shown in FIG. 9(a) using examples of Example 11 and Example 6, where Example 11 is screen printed and dried on PET first followed by printing and drying of Example 6. Furthermore, FIGS. 9(b) and 9(c) show the compatibility of metal ink and dielectric inks on each other, respectively. For example, FIG. 9(b) shows the test results of Example 15 and Example 26, where Example 15 is screen printed and dried on PET first followed by printing and curing or drying of Example 26 either by UV or thermal method. Similarly, FIG. 9(c) shows the test results of Example 22 and Example 12, where Example 22 is screen printed and UV or thermally cured on PET first followed by printing and drying of Example 12. A representative image of the compatibility test results of metal, graphene and dielectric inks is shown in FIG. 9(d) using examples of Example 11, Example 22 and Example 3, where step 1 is screen printing and drying of Example 11 on PET, step 2 is screen printing and UV curing Example 22 and Step 3 is screen printing and drying of Example 3 on PET first followed by printing and drying of Example 12, revealing a highly compatible material set.

A representative image of the compatibility testing of metal, graphene and dielectric ink is shown in FIG. 9 using Examples 3, 11, and Example 22, which reveals a highly compatible material set.

The invention claimed is:

1. A multilayered structure comprising:
   a) a flexible substrate, wherein the flexible substrate comprises a polyester or polycarbonate based film;
   b) a layer comprising a metal ink on the flexible substrate;
   c) a layer comprising a graphene ink on the layer comprising a metal ink; and
   d) a layer comprising a dielectric ink on the layer comprising a graphene ink,
   wherein the graphene ink comprises:
   (i) at least one polymeric binder, the polymeric binder comprising from about 25% to about 100% by weight of thermoplastic resins comprising homo-polymers or copolymers, and at least one of about 1% to about 50% by weight polyester resin, about 1% to about 20% by weight phenoxy resin, and about 1% to about 50% by weight thermoset network forming resins;
   (ii) at least one solvent; and
   (iii) graphene.

2. A multilayered structure according to claim 1, wherein the flexible substrate, layer comprising metal ink, layer comprising graphene ink, and layer comprising dielectric ink exhibit high compatibility such that adhesion between the layers, as measured in accordance with ASTM D3359, is at least 3B.

3. The multilayered structure according to claim 1, wherein the metal ink comprises:
   a) at least one polymeric binder;
   b) at least one solvent;
   c) at least one surfactant; and
   d) a conductive filler selected from the group consisting of metal fillers, organo-silver compounds, graphene, and combinations of one or more of the foregoing.

4. The multilayered structure according to claim 3, wherein the metal filler is selected from the group consisting of micron-sized silver flakes, nano-silver, micron-sized silver coated copper flakes, micron-sized silver coated copper-nickel-zinc flakes, and combinations of one or more of the foregoing.

5. The multilayered structure according to claim 1, wherein the graphene ink further comprises at least one or more of graphite, carbon black, or carbon nano-tubes.

6. The multilayered structure according to claim 1, wherein the polymeric binder further comprises conducting polymers.

7. The multilayered structure according to claim 1, wherein the thermoplastic resin is selected from the group consisting of poly(vinylidene chloride), poly(vinylidene chloride-co-acrylonitrile), poly(vinylidene chloride-co-methyl acrylate), poly(acrylonitrile-co-vinylidene chloride-co-methyl methacrylate), phenoxy resins which contain polyester, polyacrylate, polyurethane, polyether or polyamide backbones, polyester resins bearing polyol, hydroxyl, amine, carboxyl acid, amide, or aliphatic chains, polyacrylate resins bearing polyol, hydroxyl, amine, carboxyl acid, amide, or aliphatic chains, polyurethane resins bearing polyol, hydroxyl, amine, carboxyl acid, amide, or aliphatic chains, polyimide resins bearing polyol, hydroxyl, amine, carboxyl acid, amide, or aliphatic chains, polyacrylonitrile, polymethyl methacrylate, polybutyl methacrylate, polytetrafluorethylene, polyvinylidene fluoride, polyvinyl chloride, polyvinylidene chloride, aliphatic polyamides, aromatic polyamides, poly(m-phenyleneisophtalamide), poly(p-phenyleneterephtalamide), polybutylene terephtalate, polycarbonates, polyethylene terephthalate, polyvinyl acetate, low-density polyethylene, high-density polyethylene, ethylene vinyl acetate, ethylene vinyl alcohol, polystyrene, acrylonitrile-butadiene-styrene terpolymer, styrene-acrylonitrile copolymer, polyoxymethylene, polyphenylene ether, polyphenylene sulphide, polypropylene, polyvinyl alcohol, polyvinyl chloride, polyurethanes, ethylene-ethyl acrylate copolymer, ethylene-methyl methacrylate copolymer, ethylene-vinyl acetate copolymer, ethylene-methacrylic acid copolymer, ethylene copolymer resins, phenoxy resins, epoxy phenol novolac resins, bisphenol-A based polyether, polyacetylene, polypyrrole, polythiophene, polyphenylene, polyacetylene, poly(p-phenylene vinylene), polyaniline and combinations of one or more of the foregoing.

8. The multilayered structure according to claim 1, wherein the solvent is selected from the group consisting of N-methyl pyrrolidone, N,N-dimethyl formamide, dihydrolevoglucosenone, cyclohexanone, C11-ketone, isophorone, ethylene glycol, propylene glycol, dipropylene glycol, 1,3-butane diol, 2,5-dimethyl-2,5-hexane diol, ethylene glycol monobutyl ether, diethylene glycol mono-n-butyl ether, propylene glycol n-propyl ether, terpineol, butyl carbitol acetate, glycol ether acetates, carbitol acetate, dibasic esters, propylene carbonate and combinations of one or more of the foregoing.

9. The multilayered structure according to claim 1, wherein the dielectric ink comprises: a) at least one polymeric binder; b) at least one solvent; c) at least one of a UV curing agent and a thermal curing agent; and d) one or more fillers.

10. The multilayered structure according to claim 9, wherein the polymeric binder comprises carbon-carbon bonded thermoplastic resins, polyurethane resins, epoxy resins, epoxy acrylates, polyurethane acrylates, polyester acrylates, polyether acrylates, monomer acrylates, dimer acrylates, trimer acrylates, tetramer acrylates, penta or hexamer acrylates and combinations of one or more of the foregoing.

11. The multilayered structure according to claim 9, wherein the solvent is selected from the group consisting of alcohols, glycol ethers, glycol esters, ketones, esters, hydrocarbons and combinations of one or more of the foregoing.

12. The multilayered structure according to claim 11, wherein the solvent is selected from the group consisting of methanol, ethanol, 2-propanol, benzyl alcohol, ethylene glycol, ethylene glycol methyl ether, butyl carbitol, butyl cellosolve, heptane, hexane, cyclohexane, benzene, xylene, dihydrolevoglucosenone, dibasic ester, isophorone, C11-ketone, toluene, and combinations of one or more of the foregoing.

13. The multi-layered structure according to claim 9, wherein the UV curing agent is selected from the group consisting of 1-hydroxy-cyclohexyl-phenyl-ketone, bis (2,4,6-trimethylbenzoyl)-phenylphosphineoxide, a 50/50 mixture of bis(2,6-dimethoxybenzoyl)-2,4,4-trimethylpentylphosphine oxide and 1-hydroxy-cyclohexyl-phenyl-ketone, phenyl glyoxylic acid methyl ester, a 50/50 mixture of diphenyl (2,4,6-trimethylbenzoyl)-phosphine oxide and 2-hydroxy-2-methyl-1-phenyl-propan-1-one, a mixture of phosphine oxide, phenyl bis(2,4,6-trimethyl benzoyl) (20 wt %) and 2-hydroxy-2-methyl-1-phenyl-1-propanone (80 wt %), 2-hydroxy-2-methyl-1-phenyl-propan-1-one, a 25/75 mixture of bis(2,6-dimethoxybenzoyl)-2,4,4-trimethylpentyl-phosphine oxide and 2-hydroxy-2-methyl-1-phenylpropan-1-one, 2-methyl-1 [4-(methylthio)phenyl]-2-morpholonopropan-1-one and combinations combinations of one or more of the foregoing.

14. The multilayered structure according to claim 9, wherein the filler is selected from the group consisting of inorganic fillers, graphene, 2D boron nitride flakes and combinations of one or more of the foregoing.

15. A multilayered structure comprising:
a) a flexible substrate, wherein the flexible substrate comprises a polyester or polycarbonate based film;
b) a layer comprising a metal ink on the flexible substrate, wherein the metal ink comprises a conductive filler selected from the group consisting of a metal filler selected from the group consisting of micron-sized silver flakes, nano-silver, micron-sized silver coated copper flakes, micron-sized silver coated copper-nickel-zinc flakes, and combinations of one or more of the foregoing, organo-silver compounds, and combinations of one or more of the foregoing;
c) a layer comprising a graphene ink on the layer comprising a metal ink; and
d) a layer comprising a dielectric ink on the layer comprising a graphene ink
wherein the graphene ink comprises:
(i) at least one polymeric binder, the polymeric binder comprising from about 25% to about 100% by weight of thermoplastic resins comprising homo-polymers or copolymers, and at least one of about 1% to about 50% by weight polyester resin, about 1% to about 20% by weight phenoxy resin, and about 1% to about 50% by weight thermoset network forming resins;
(ii) at least one solvent; and
(iii) graphene.

* * * * *